US007787640B2

(12) United States Patent
Turicchia et al.

(10) Patent No.: US 7,787,640 B2
(45) Date of Patent: Aug. 31, 2010

(54) SYSTEM AND METHOD FOR SPECTRAL ENHANCEMENT EMPLOYING COMPRESSION AND EXPANSION

(75) Inventors: Lorenzo Turicchia, Boston, MA (US); Rahul Sarpeshkar, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1215 days.

(21) Appl. No.: 10/830,561

(22) Filed: Apr. 23, 2004

(65) Prior Publication Data

US 2004/0252850 A1 Dec. 16, 2004

Related U.S. Application Data

(60) Provisional application No. 60/465,116, filed on Apr. 24, 2003.

(51) Int. Cl.
*H03G 5/00* (2006.01)
*H03G 7/00* (2006.01)

(52) U.S. Cl. .......................................... 381/98; 381/106

(58) Field of Classification Search ................... 381/98, 381/94.2, 99, 100, 61, 106, 320; 333/28 T, 333/28 R, 132; 704/200.1, 224, 234, 241, 704/209, 268
See application file for complete search history.

(56) References Cited

U.S. PATENT DOCUMENTS 3,846,719 A * 11/1974 Dolby ......................... 333/14
4,025,723 A 5/1977 Blackledge
4,433,435 A * 2/1984 David ......................... 381/94.2
4,696,044 A * 9/1987 Waller, Jr. .................... 381/106
5,050,217 A * 9/1991 Orban ........................ 381/94.2
5,067,157 A * 11/1991 Ishida et al. .................. 381/13
5,077,800 A * 12/1991 Dupret et al. ............... 381/316
5,321,758 A * 6/1994 Charpentier et al. ......... 381/317
5,418,859 A * 5/1995 Cho ............................ 381/98
5,485,524 A * 1/1996 Kuusama et al. ........... 381/94.3

(Continued)

OTHER PUBLICATIONS

"Auditory Model Simulation for the Study of Selective Listening," Fjallbrant et al., Tencon '96. *Proceedings., 1996 IEEE Tencon. Digital Signal Processing Applications*, pp. 113-118.
"Biological Basis of Hearing-Aid Design," Sachs et al., *Annals of Biomedical Engineering*, vol. 30, pp. 157-168 (2002).

(Continued)

*Primary Examiner*—Vivian Chin
*Assistant Examiner*—Kile Blair
(74) *Attorney, Agent, or Firm*—Gauthier & Connors LLP

(57) ABSTRACT

A spectral enhancement system is disclosed that includes an input node for receiving an input signal, at least one broad band pass filter coupled to the input node and having a first band pass range, at least one non-linear circuit coupled to the filter for non-linearly mapping a broad band pass filtered signal by a first non-linear factor n, at least one narrow band pass filter coupled to the non-linear circuit and having a second band pass range that is narrower than the first band pass range, and an output node coupled to the narrow band pass filter for providing an output signal that is spectrally enhanced.

37 Claims, 17 Drawing Sheets

U.S. PATENT DOCUMENTS

| | | | | | |
|---|---|---|---|---|---|
| 5,832,097 | A * | 11/1998 | Armstrong et al. | .......... | 381/321 |
| 6,885,752 | B1 * | 4/2005 | Chabries et al. | ............. | 381/321 |
| RE38,822 | E * | 10/2005 | Aarts et al. | .................... | 381/61 |
| 2005/0123153 | A1 * | 6/2005 | Toki | ........................... | 381/106 |

OTHER PUBLICATIONS

"The Silicon Cochlea: from Biology to Bionics," Turicchia et al., *Proceedings of the Biophysics of the Cochlea-Molecules to Models Conference*, pp. 417-424 (Jul. 27, 2002-Aug. 1, 2002).

* cited by examiner

SYSTEM AND METHOD FOR SPECTRAL ENHANCEMENT EMPLOYING COMPRESSION AND EXPANSION

PRIORITY

This application claims priority to U.S. Provisional Application Ser. No. 60/465,116 filed Apr. 24, 2003.

BACKGROUND OF THE INVENTION

The invention generally relates to spectral enhancement systems for enhancing a spectrum of multi-frequency signals, and relates in particular to spectral enhancement systems that involve filtering and nonlinear operations. Conventional spectral enhancement systems typically involve filtering a complex multi-frequency signal to remove signals of undesired frequency bands, and then nonlinearly mapping the filtered signal in an effort to obtain a spectrally enhanced signal that is relatively background free.

In many systems, however, the background information may be difficult to filter out based on frequencies alone. For example, many multi-frequency signals may include background noise that is close to the frequencies of the desired information signal, and may amplify some background noise with the amplification of the desired information signal.

As shown in FIG. 1, a conventional spectral enhancement system may include one or more band pass filters 10, 12 and 14, each having a different pass band frequency and into each of which an input signal is presented as received at an input port 16. The system also includes one or more compression units 18, 20, 22 that provide different amounts of amplification. The outputs of the compression units 18-22 are combined at a combiner 24 to produce an output signal at an output port 26. If the frequencies of the desired signals (such as a vowel sound in an auditory signal) are either within a band pass frequency or are surrounded by substantial noise signals in the frequency spectrum, then such a filter and amplification system may not be sufficient in certain applications. Moreover, multi-channel compression by itself improves audibility but degrades spectral contrast. A weak tone at one frequency is strongly amplified so that it is concurrently audible with a strong tone at another frequency that is weakly amplified. The asymmetric amplification due to compression degrades the spectral contrast that was present in the uncompressed stimulus.

Increasing spectral contrast and simultaneously performing compression for the hearing impaired appears to yield a modest but significant improvement for speech perception in noise.

See, for example, "Spectral Contrast Enhancement of Speech in Noise for Listeners with Sensorineural Hearing Impairments: Effects on Intelligibility, Quality, and Response Times", by T. Baer, B. C. J. Moore and S. Gatehouse, *J. Rehabil. Res. Dev.*, vol. 30, no. 1, pp. 49-72 (1993). Certain other research demonstrates a strong benefit of using vowels with well-contrasted formants in the auditory nerves of acoustically traumatized cats and discusses its implications for hearing-aid designs. See, for example, "Frequency Shaped Amplification Changes the Neural Representation of Speech with Noise-Induced Hearing Loss," by J. R. Schilling, R. L. Miller, M. B. Sachs and E. D. Young, *Hear Res.*, vol. 117, pp. 57-70, March 1998; "Contrast Enhancement Improves the Representations of ϵ-like Vowels in the Hearing Impaired Auditory Nerve," by R. L. Miller, B. M. Calhoun and E. D. Young, *J. Acoustic Soc. Am.*, vol. 106, no. 2, pp. 157-68 (2002); and "Biological Basis of Hearing-Aid Design," by M. B. Sachs, I. C. Bruce, R. L. Miller and E. D. Young, *Ann Biomed. Eng.*, vol. 30, no. 2, pp. 157-168 (2002). An interesting analog architecture uses interacting channels to improve spectral contrast although without multi-channel syllabic compression. See, for example, "Spectral Feature Enhancement for People with Sensorineaural Hearing Impairments: Effects on Speech Intelligibility and Quality," by M. A. Stone and C. B. J. Moore, *J. Rehab. Res. Dev.*, vol. 29, no. 2, pp.39-56 (1992).

Digital systems have also been developed for providing detailed analysis of the input signal in an effort to amplify only the desired signal, but such systems remain too slow to fully operate in real time. For example, see Spectral Contrast Enhancement Algorithms and Comparisons," by J. Yang, F. Lou and A. Nehoria, *Speech Communications*, vol. 39, January 2003. Moreover, such systems also have difficulty distinguishing between the desired signal and background noise.

There is a need therefore, for an improved spectral enhancement system that efficiently and economically provides an improved spectrally enhanced information signal.

SUMMARY

The invention provides a spectral enhancement system in accordance with an embodiment of the invention that includes an input node for receiving an input signal, at least one broad band pass filter coupled to the input node and having a first band pass range, at least one non-linear circuit coupled to the filter for non-linearly mapping a broad band pass filtered signal by a first non-linear factor n, at least one narrow band pass filter coupled to the non-linear circuit and having a second band pass range that is narrower than the first band pass range, and an output node coupled to the narrow band pass filter for providing an output signal that is spectrally enhanced In accordance with another embodiment, the invention provides a spectral enhancement system including an input node for receiving an input signal, at least one first band pass filter coupled to the input node and having a first band pass range, at least one first non-linear circuit coupled to the first band pass filter for non-linearly mapping a first band pass filtered signal by a first non-linear factor n,, at least one second band pass filter coupled to the one non-linear circuit and having a second band pass range, at least one second non-linear circuit coupled to the second band pass filter for non-linearly mapping a second band pass filtered signal by a second non-linear factor $n_2$, and an output node coupled to the second band pass filter for providing an output signal that is spectrally enhanced.

In a further embodiment, the invention provides a method of providing spectral enhancement that includes the steps of receiving an input signal, coupling the input signal to at least one broad band pass filter having a first band pass range, coupling the at least one broad band pass filter to at least one non-linear circuit for non-linearly mapping a broad band pass filtered signal by a first non-linear factor n, coupling the at least one non-linear circuit to at least one narrow band pass filter having a second band pass range that is narrower than the first band pass range, and providing an output signal that is spectrally enhanced at an output node that is coupled to the narrow band pass filter.

In a further embodiment, the invention provides a method of providing spectral enhancement that includes the steps of receiving an input signal at an input node, coupling the input node to at least one first band pass filter having a first band pass range, coupling the first band pass filter to at least one first nonlinear circuit for non-linearly mapping a first band pass filtered signal by a first non-linear factor n,, coupling the one non-linear circuit to at least one second band pass filter having a second band pass range, coupling the second band pass filter to at least one second nonlinear circuit for non-linearly mapping a second band pass filtered signal by a second non-linear factor $n_2$, and providing an output signal that is spectrally enhanced to an output node that is coupled to the second band pass filter In yet another embodiment, the invention provides a method of providing spectral enhancement that includes the steps of receiving an input signal, coupling the input signal to at least one broad band pass filter having a first band pass range, coupling the at least one broad band pass filter to at least one mapping circuit for mapping a broad band pass filtered signal by a first factor n, coupling the at least one non-linear circuit to at least one narrow band pass filter having a second band pass range that is narrower than said first band pass range, and providing an output signal that is spectrally enhanced at an output node that is coupled to the narrow band pass filter, wherein the output signal has a range of frequencies that is defined responsive to the second band pass range and each frequency has a respective amplitude that is defined responsive to the first band pass range

BRIEF DESCRIPTION OF THE DRAWING

The following description may be further understood with reference to the accompanying drawings in which.

DETAILED DESCRIPTION OF THE ILLUSTRATED EMBODIMENTS

The present invention provides a system and method for spectral enhancement that involves compressing-and-expanding, (referred to herein as companding). The companding strategy simulates the masking phenomena of the auditory system and implements a soft local winner-take-all-like enhancement of the input spectrum. It performs multi-channel syllabic compression without degrading spectral contrast. The companding strategy works in an analog fashion without explicit decision making, without the use of the FFT, and without any cross-coupling between spectral channels. The strategy may be useful in cochlear-implant processors for extracting the dominant channels in a noisy spectrum or in speech-recognition front ends for enhancing formant recognition.

In accordance with an embodiment, the invention provides an analog architecture based on the compressive and tone-to-tone suppression properties of the biological cochlea and auditory system. Certain embodiments disclosed herein perform simultaneous multi-channel syllabic compression and spectral-contrast enhancement via masking. When masking strategies that enhance contrast are also simultaneously present, the compression is prevented from degrading spectral contrast in regions close to a strong special peak while allowing the benefits of improved audibility in regions distant from the peak.

Figure 2:
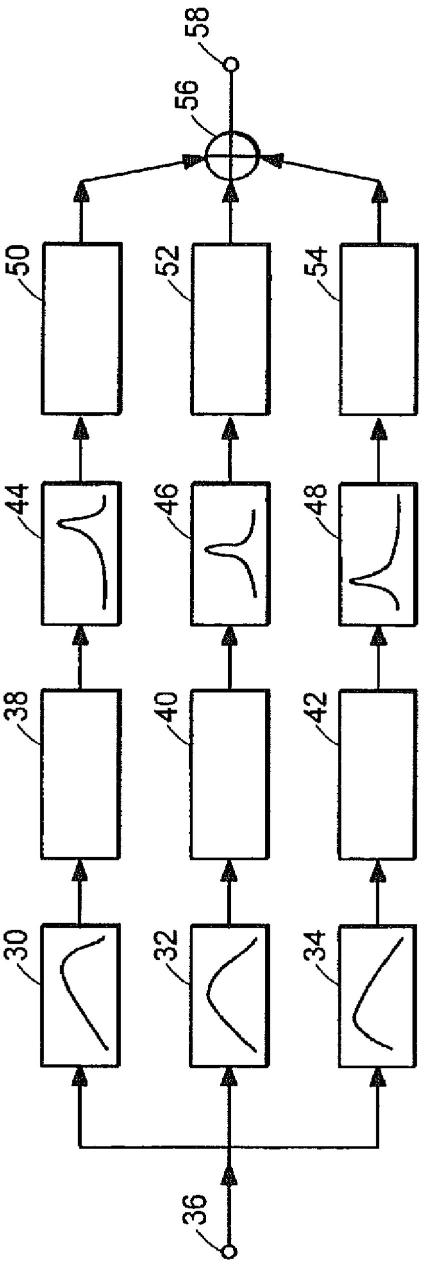
FIG. 2 shows an illustrative diagrammatic schematic view of a spectral enhancement system in accordance with an embodiment of the invention.

A system of an embodiment of the invention uses a non-interacting filter bank, compression units, a second filter bank an expansion units. In particular, as shown in FIG. 2, the system may include a first set of band pass filters 30, 32 and 34 that each provide a relatively wide pass band to an input signal received at an input port 36. The outputs of the filters 30, 32 and 34 are received at compression units 38, 40, 42 respectively, and the outputs of the compression units are provided to a second set of band pass filters 44, 46 and 48 respectively.

Each of the filters 44, 46 and 48 provides a relatively narrow pass band. The outputs of the filters 44, 46 and 48 are received at expansion units 50, 52 and 54 respectively and combined at combiner 56 to provide an output signal at an output node 58 One feature of this architecture is that it provides for the presence of a second filter bank between the compression and expansion blocks. Programmability in the masking and compression characteristics may be maintained through parametric changes in the compression, expansion, and/or filter blocks.

The masking benefits for enhancing spectral contrast are achieved in the system of FIG. 2 because of the nonlinear nature of the interaction between signals in the first filter bank, the compressor, and the second filter bank. Every channel in the companding architecture has a pre-filter, a compression block, a post-filter and an expansion block. The pre-filter and post-filter in every channel have the same resonant frequency. The pre-filter and post-filter banks have logarithmically-spaced resonant frequencies that span the desired spectral range.

Figure 3:
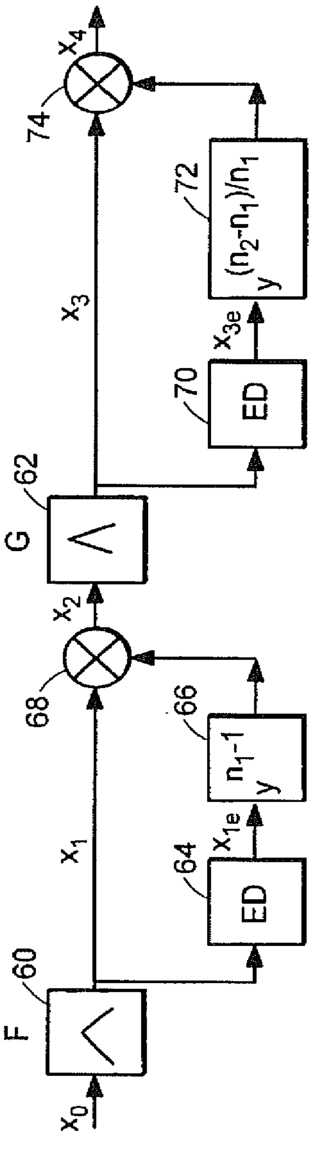
FIG. 3 shows an illustrative schematic view of a spectral enhancement circuit in accordance with an embodiment of the invention.

FIG. 3 shows a more detailed illustration of a single channel of the architecture shown in FIG. 2. The pre-filter is shown at 60 and is labeled as F, and the post-filter is shown at 62 and is labeled as G. The compression is implemented with an envelope detector (ED) block 64, a nonlinear block 66, and a multiplier 68 in a feed-forward fashion. Similarly, the expansion is implemented with an ED block 70, a nonlinear block 72, and a multiplier 74 in a feed-forward fashion. The time constant of the envelope detector governs the dynamics of the compression or expansion and is typically scaled with the resonant frequency of each channel. In general, compression or expansion schemes can involve sophisticated dynamics and energy extraction strategies (peak vs. rms etc).

Figure 1:
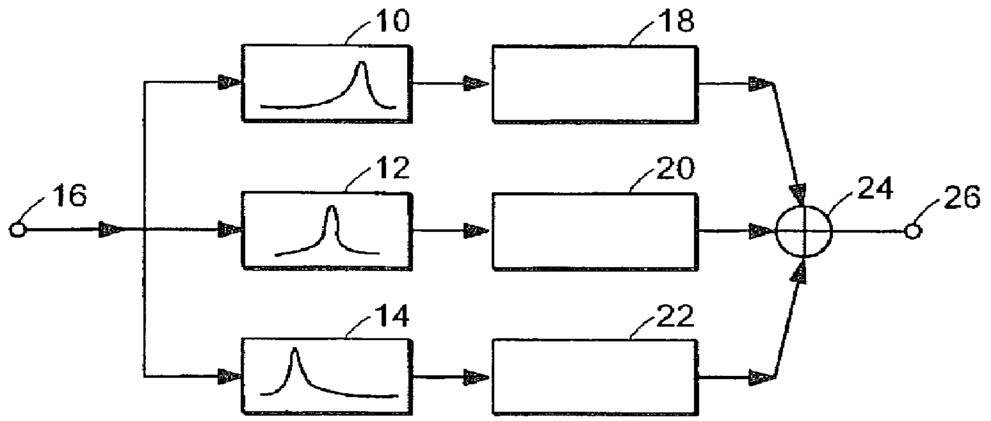
FIG. 1 PRIOR ART
FIG. 1 shows an illustrative diagrammatic schematic view of a spectral enhancement system of the prior art.

In the nonlinear block 66 in FIG. 2, $n_1$ represents the compression index of the compression block, e.g., $n_1=0.3$ would yield third-root compression on the input in the compression block. If $n_2=1$, then the expansion block simply undoes the effect of the compression block and the channel is input-output linear on the time-scale of the envelope-detector dynamics. If $0<n_2<1$, then the effect of the channel is to implement syllabic compression with an overall channel compression index of $n_2$. The expansion block implements an $n_2/n_1$ power law and is thus really an expansion block only if $n_2>n_1$. In all cases, setting $n_1=1$ will shut off the companding strategy and create a multi-channel syllabic compression system like that of FIG. 1 with a compression index of $n_2$.

Figure 4:
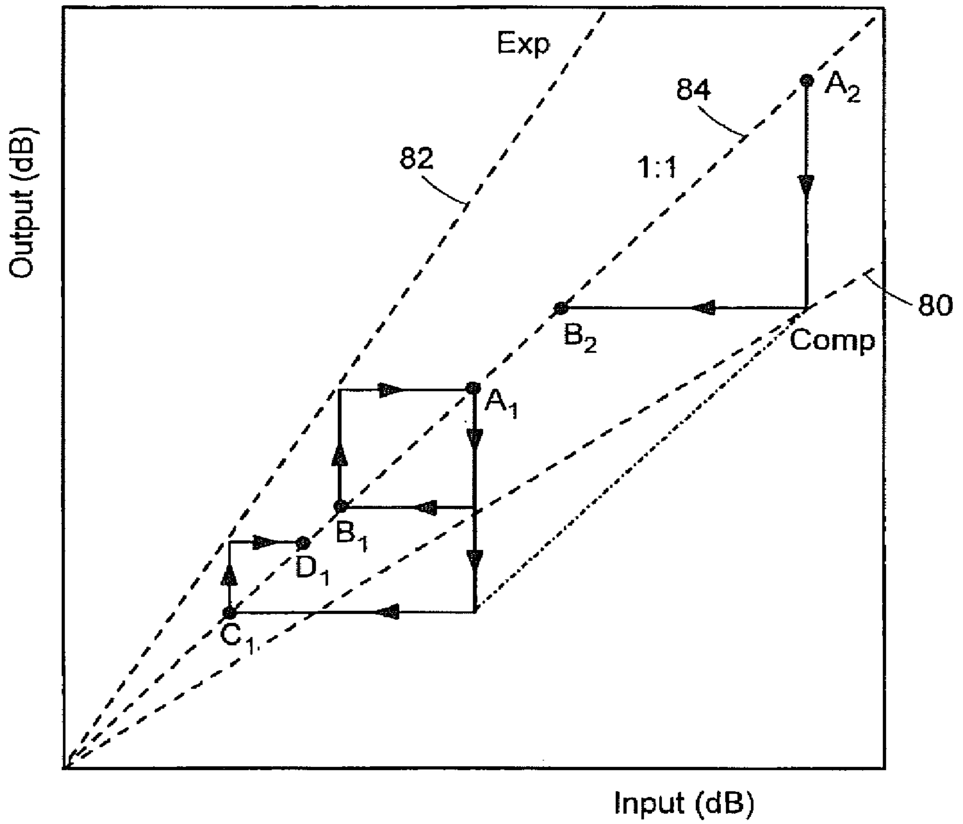
FIG. 4 shows an illustrative diagrammatic graphical representation of the operation of a spectral enhancement system in accordance with an embodiment of the invention.

First, if $n_2$ is 1, the overall effect of a channel is that it is input-output linear. If a sinusoid signal is input at the resonant frequency of the channel, the compression stage compresses the signal and the expansion stage undoes the compression. FIG. 4 illustrates how this works by plotting the effects of the compression and expansion on a dB or logarithmic scale. The compression line 80 has a slope less than 1 on this plot and the expansion line 82 has a slope greater than 1 on this plot. A sinusoid with amplitude $A_1$ is transformed to a sinusoid with amplitude $B_1$ after the compression block. The sinusoid with amplitude $B_1$ is transformed back to a sinusoid of amplitude $A_1$ after expansion, i.e., we traverse the square with comers at $A_1$ and $B_1$ as we compress and expand the signal and return to the $A_1$ starting point. Note that the 1:1 line 84 in FIG. 4 may be used to map the output of one stage of processing to the input of the next stage of processing.

The above architecture permits the masking or tone-to-tone suppression through the use of the post-filter. Assume that the pre-filter F is a broad almost perfectly flat filter and that post-filter G is very narrowly tuned. If, in addition to $A_1$ at the resonant frequency of the channel, we also have a sinusoid of stronger amplitude $A_2$ at a different frequency in the input, then, after filtering by F, we obtain two sinusoids represented as $A_1$ (the weaker) and $A_2$ (the stronger) in FIG. 4. Since the envelope detector sets the gain of the compression block based primarily on the stronger tone, $A_2$ is transformed to $B_2$ and $A_1$ is transformed to $C_1$ after compression. If the post-filter G is sharply tuned to suppress the louder tone $A_2$, the expansion stage will only see a weak tone of amplitude $C_1$ at its input and expand that tone to a tone of amplitude $D_1$ at its output. Since $D_1$ is clearly less than $A_1$ in FIG. 4, we observe that an out-of-band strong tone $A_2$ has effectively suppressed an in-band weak tone $A_1$ to an output of amplitude $D_1$. If $A_2$ were not simultaneously present the $A_1$ tone would have had its amplitude unchanged by the overall channel. The suppression arises because the dB reduction in gain caused by the compression is large because of the strong out-of-band tone $A_2$ but the dB increase in gain caused by the expansion is small because of the weak in-band tone $C_1$. The dB suppression of the input $A_1$ by $A_2$ is given by the difference in dB between the asymmetric compression and expansion. Note that if $A_1$ were much stronger than $A_2$ then, the G filter would simply attenuate $A_2$ and leave $A_1$ almost unchanged. Thus, in all cases, the stronger tone has the effect of suppressing the weaker tone.

Changing certain of the above assumptions would clearly affect the overall architecture. If F is not perfectly flat, but has a finite bandwidth, then the suppressive effect of $A_2$ on $A_1$ will be reduced as the frequencies of the tones get more distant from each other. If G is not perfectly narrow and relatively flat, then the compression and expansion gains in dB will be determined by the strong $A_2$ and $B_2$ tones respectively, will be nearly equal, will result in little suppression of $A_1$ by $A_2$, and will dominate the response of the channel. Thus, if F is broad, distant tones cause stronger suppression of $A_1$, while if G is broad, tones for a broad range of frequencies near $A_1$ are ineffective in causing suppression of $A_1$. Together, the shapes of F and G determine the masking frequency profile. The smaller the value of $n_1$, the more flat is the compression curve and the more steep is the expansion curve. Thus, the difference in compression and expansion gains in dB is larger for smaller $n_1$, and the suppressive effects of masking are stronger for smaller $n_1$. The value of $n_2$ affects the overall compression characteristics of the channel but does not change the masking properties as discussed above.

The value of the signal at various stages of processing in FIG. 3 may be determined as follows. Suppose, that at the input, we have $$x_0=\alpha_1 \sin(w_1 t)+\alpha_2 \sin(w_2 t+\phi_0) \quad (1)$$

If the gain and phase of the filter F at frequencies $w_1$ and $w_2$ are given by:

$$f_1=|F(jw_1)|, f_2=|F(jw_2)|$$

$$\phi_1=\text{ang}(F(jw_1)), \text{ and} \quad (2)$$

$$\phi_2=\text{ang}(F(jw_2))$$

then, $$x_1=f_1\alpha_1 \sin(w_1 t+\phi_1)+f_2\,\alpha_2 \sin(w_2 t+\beta\phi_0+\phi_2) \quad (3)$$

Suppose, we have nearly ideal peak detection in the envelope detector, and that the frequency ratio $w_1/w_2$ is not a small rational number, then the envelope of $x_1$ may be approximated by $$x_{1e}=f_1\alpha_1+f_2\alpha_2 \quad (4)$$

Thus, after compression, $$x_2=x_1 x_{1e}^{(n1-1)} \quad (5)$$

If $$g_1=|G(jw_1)|, g_2=|G(jw_2)|$$

$$\theta_1=\text{ang}(G(jw_1)), \text{ and} \quad (6)$$

$$\theta_2=\text{ang}(G(jw_2))$$

then, $$x_3=[g_1 f_1\alpha_1\sin(w_1t+\phi_1+\theta_1)+g_2 f_2\alpha_2\sin(w_2t+\phi_0+\beta\phi_2+\theta_2)]x_{1e}^{(n_1-1)} \quad (7)$$

and the envelope of $x_3$ may be approximated by $$x_{3e}=(g_1 f_1\alpha_1+g_2 f_2\alpha_2)x_{1e}^{(n_1-1)} \quad (8)$$

where $x_{3e}$ is the output of the envelope detector.

$$\begin{aligned} x_4 &= x_3 x_{3e}^{\left(\frac{n_2 n_1}{n_1}\right)} \quad (9)\\ &= [g_1 f_1 a_1 \sin(w_1 t+\varphi_1+\vartheta_1)+g_2 f_2 a_2 \sin(w_2 t+\varphi_0+\varphi_2+\vartheta_2)] \\ &\quad x_{1e}^{\left(\frac{n_2-n_1}{n_1}\right)}\cdot\left((g_1 f_1 a_1+g_2 f_2 a_2)x_{1e}^{(n_1-1)}\right)^{\left(\frac{n_2-n_1}{n_1}\right)} \\ &= [g_1 f_1 a_1 \sin(w_1 t+\varphi_1+\vartheta_1)+g_2 f_2 a_2 \sin(w_2 t+\varphi_0+\varphi_2+\vartheta_2)]\cdot \\ &\quad (g_1 f_1 a_1+g_2 f_2 a_2)^{\left(\frac{n_2-n_1}{n_1}\right)} x_{1e}^{n_2\frac{n_2-1}{n_1}} \end{aligned}$$

If $g_1=f_1=1$ (the pre and post filters have a resonance frequency of $w_1$) and $g_2=0$ (G is sharply tuned and $w_2$ is distant from $w_1$), then $$x_4=\left[a_1^{n_2/n_1}(a_1+f_2a_2)^{n_2\frac{n_1-1}{n_1}}\right]\sin(w_1t+\varphi_1+\vartheta_1)=\left[a_1\left(\frac{a_1+f_2a_2}{a_1}\right)^{\frac{n_1-1}{n_1}}\right]^{n_2}\sin(w_1t+\varphi_1+\vartheta_1) \quad (10)$$

Thus, the presence of a second tone with amplitude $\alpha_2$ suppresses the tone with amplitude $\alpha_1$. If there is only one tone ($\alpha_2=0$), then $$x_4=\sin(w_1t+\phi_1+\theta_1)\alpha_1^{n_2} \quad (11)$$

such that, if $n_2=1$, the output has amplitude $\alpha_1$.

Figure 5:
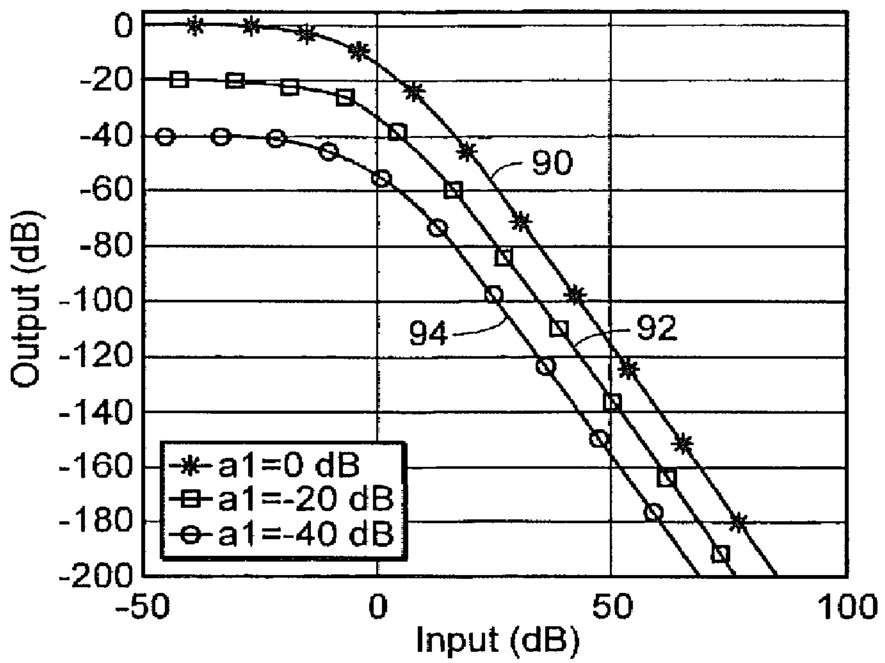
FIGS. 5-7 show illustrative diagrammatic graphical views of tone-to-tone suppression in various channels in accordance with further embodiments of the invention.

FIG. 5 shows tone-to-tune suppression values in one channel as the suppressor tone's amplitude $\alpha_2$ varies with respect to the fixed suppressed tone's amplitude ($\alpha_1$ equal to 0 dB, −20 dB, and −40 dB in as shown at 90, 92 and 94 respectively). The amplitude of $\alpha_2/\alpha_1$ is plotted in dB on the x-axis while the output amplitude of the suppressed tone is plotted on the y-axis. The filter parameters in Equation (1) are $f_2=1$ (F is broad), and $n_1=0.3$. With a small suppressor amplitude $\alpha_2$, the output is equal to the amplitude f the suppressed tone $\alpha_1$. As $\alpha_2$ becomes large, the output becomes very small due to suppression.

Figure 6:
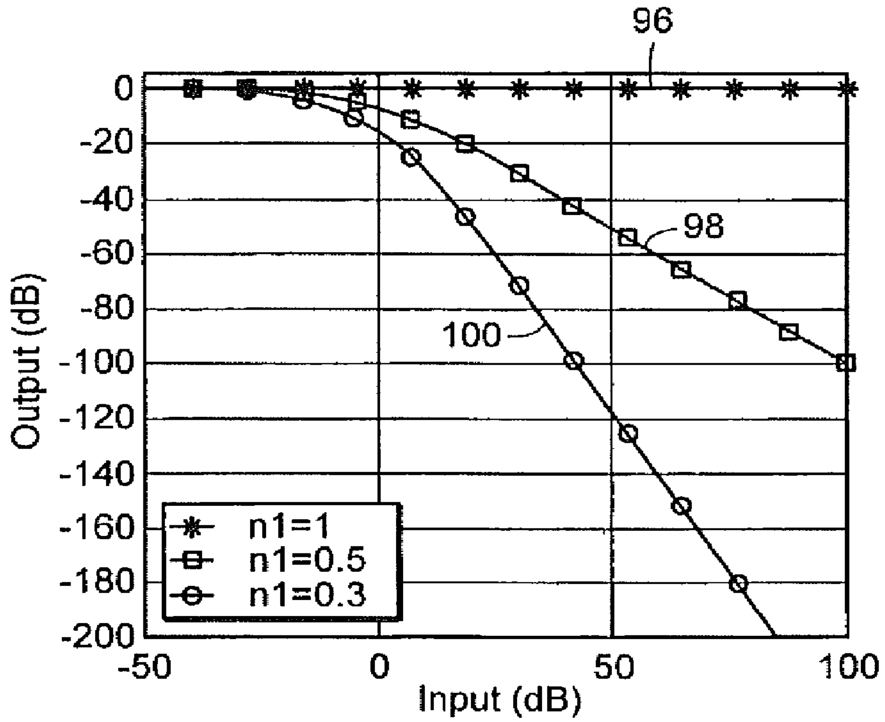

FIG. 6 shows tone-to-tone suppression values in one channel plotted as in FIG. 5 but the three plots are for different values of $n_1$ ($n_1=1$, $n_1=0.5$ and $n_1=0.3$ as shown at 96, 98 and 100 respectively). The suppressed tone's amplitude, $\alpha_1$, is fixed at 0 dB while the amplitude $\alpha_2$ varies. When $n_1=1$ the companding strategy is off and there is no suppression. All plots have $f_2=1$ (F is broad). Note that smaller values of $n_1$ result in greater suppression.

Figure 7:
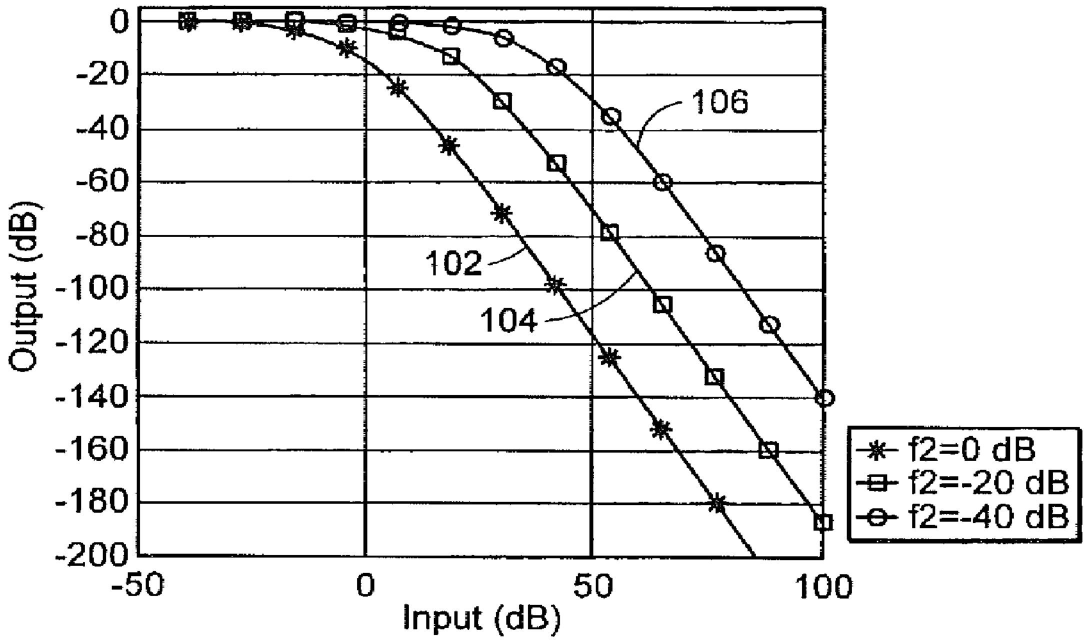

FIG. 7 shows tone to tone suppression values in one channel plotted as in FIG. 5 but with different values of $f_2$ corresponding to different F filters ($f_2=0$ dB, $f_2=-20$ dB and $f_2=-40$ dB as shown at 102, 104 and 106 respectively). The plot with $f_2=0$ dB corresponds to a broad F filter and results in more suppression while that with $f_2=-40$ dB is sharp and results in less suppression. The suppressed tone's amplitude, $\alpha_1$, is fixed at 0 dB while the amplitude $\alpha_2$ varies; $n_1=0.3$.

FIGS. 5, 6 and 7 show the amplitude of $x_4$ in Equation (11) versus the amplitude ratio of the two tones $\alpha_2$ and $\alpha_1$ expressed in dB. The value $n_2=1$ is used in all figures. The amplitude of the suppressed tone $\alpha_1$ is fixed while the amplitude of the suppressor tone $\alpha_2$ varies. FIG. 5 shows that with a small suppressor amplitude $\alpha_2$, the output is equal to the amplitude of the suppressed tone $\alpha_1$. As $\alpha_2$ becomes large, the output becomes very small due to suppression. FIG. 6 shows that smaller values of $n_1$ result in greater suppression. FIG. 7 shows that narrow filters that result in small values of $f_2$ in Equation (11) cause less suppression than broad filters with larger values of $f_2$.

Any masking profile, therefore, may be achieved by varying the filter, compression, and expansion parameters: An asymmetric profile in F will result in asymmetric masking and a broader profile in F will result in broader band masking. Small values of $n_1$ yield stronger masking while the value of $n_2$ affects the overall compression characteristics of the system. The sharpness in tuning of the G filter determines the frequency region around the suppressed tone where masking is ineffective. The dynamics of the envelope detectors determine the attack and release time constants of the compression and thus the time course of overshoots and undershoots in transient responses. Nonlinear gain control due to saturation in the envelope detectors is important in determining the transient distortion of the system. Low order band-pass filters may be used in the above examples. In other embodiments, zero-phase versions of these filters, and in further embodiments more sophisticated filters may be used.

The companding architecture shown in FIG. 2 and FIG. 3 was implemented with 50 channels in MATLAB. The number of channels was chosen to reflect numbers that could soon be seen in advanced cochlear-implant processors. The architecture does not necessarily need this number of channels. Band-pass filters for F and G were chosen with transfer functions as described by $F_i(s)=F_i'^2(s)$ and $G_i(s)=G_i'^2(s)$ where $F_i'(s)$ and $G_i'(s)$ are:

$$F_i'(s)=\left(\frac{2(\tau_i/q_1)s}{\tau_i^2s^2+2(\tau_i/q_1)s+1}\right)^2 \quad (12)$$

$$G_i'(s)=\left(\frac{2(\tau_i/q_2)s}{\tau_i^2s^2+2(\tau_i/q_2)s+1}\right)^2 \quad (13)$$

In effect, to create $F_i(s)$ and $G_i(s)$ we apply $F_i(s)$ and $G_i'(s)$ twice respectively. As discussed further below, if zero-phase versions of $F_i(s)$ and $G_i(s)$ are needed, then we apply $F_i'(s)$ or $G_i'(s)$ once in the forward time direction and once in the reverse time direction. Each channel has a resonance frequency given by $f_r=1/(2\pi\tau)$. The filters have resonance frequencies that are logarithmically spaced between 250 Hz and 4000 Hz across the 50 channels. For most experiments, the values $q_1=2.8$ (the Q the F filters) and $q_2=4.5$ (the Q of the G filters) were used.

The envelope detector in each channel was built with an ideal rectifier and a first-order low-pass filter that is applied twice. For the zero-phase experiments, the low-pass filter was applied once in the forward time direction and once in the reverse time direction. The poles of the low-pass filter were chosen to scale with the resonant frequency of the channel, i.e., $\tau_{EDi}=w\tau_i$. We chose w=40 for all experiments except for the cochlear-implant simulations discussed below, where we chose w=10.

The properties of the entire architecture are similar to the properties of a single channel except for the final summation at the output. The sum of a bunch of filtered outputs can cause interference effects due to phase differences across channels. The interference effects can be severe if the filters are not sharply tuned because the same sinusoidal component is present in several channel outputs with different phases. The companding architecture alleviates interference effects because the local winner-take-all behavior suppresses the outputs of interfering channels.

When companding is turned off in our architecture, i.e., $n_1=1$, interference across channels due to phase differences results in severe attenuation of the output. However, in some experiments, it was desired to compare the effects of using companding versus not using companding. To permit such comparisons, zero-phase versions of the F and G filters were used to avoid interference problems. For companding architectures where interference across channels is not a big problem, the use of zero-phase filters appears to make little difference. However, for architectures where the companding is turned off, the use of zero-phase filters appears to be essential. To create zero-phase versions of the $F_i(s)$ or $G_i(s)$ we time reverse the filtered outputs of $F_i'(s)$ or $G_i'(s)$ respectively, filter with the same $F_i'(s)$ or $G_i'(s)$ filter again, and time reverse the final output. The zero-phase version of $F_i(s)$ then has the same magnitude transfer function as Fi'(s) but an identically zero phase transfer function. The zero-phase version of the low-pass filter in the envelope detector is created in a similar fashion.

Figure 8:
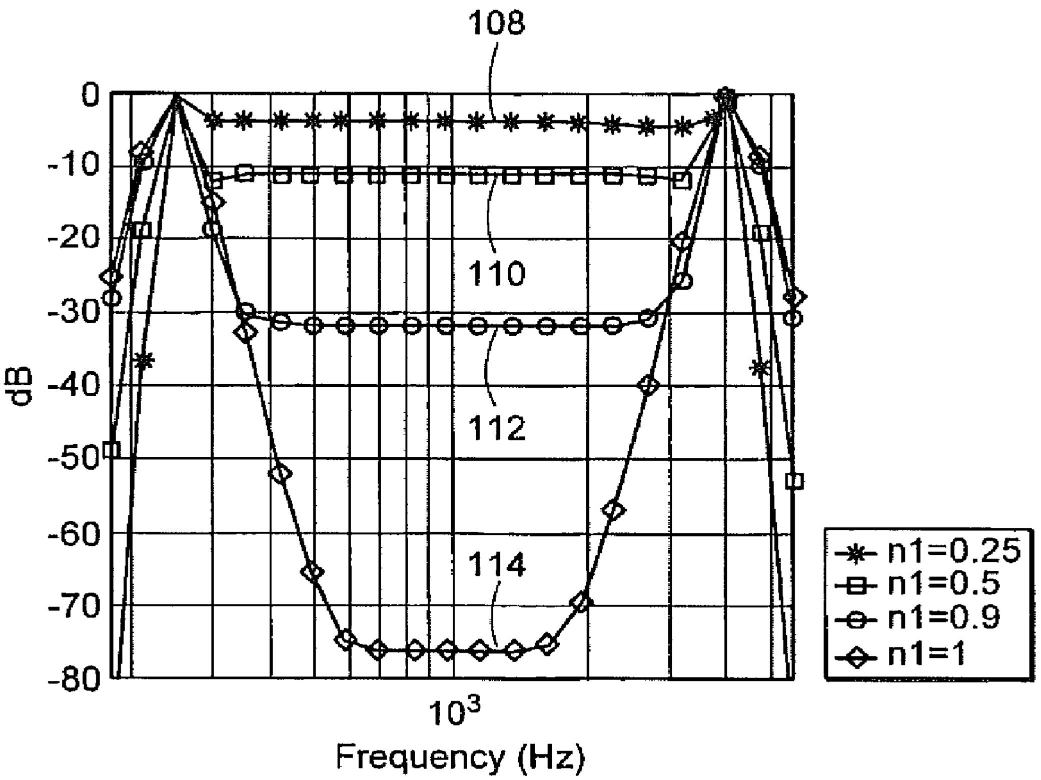
FIG. 8 shows an illustrative diagrammatic graphical view of magnitude transfer functions for systems in accordance with further embodiments of the invention.

FIG. 8 shows the magnitude transfer function of the overall architecture shown in FIG. 2 for different values of $n_1$ ($n_1=0.25$, $n_1=0.5$, $n_1=0.9$ and $n_1=1$ as shown at 108, 110, 112 and 114 respectively) The companding strategy is off for $n_1=1$. Higher amounts of compression (smaller values of $n_1$) flatten the transfer function's profile because they result in less interference amongst channels. Small ripples in the transfer function, not visible in the figure, are caused by the resonances of the 50 channel filters. With $n_1=1$, there is no companding, and a large attenuation is observed for frequencies in the central portions of the spectrum due to interference effects. At the borders of the spectrum, there is less attenuation because of a reduction in the amount of interference caused by edge effects. As the value of $n_1$ falls, the effects of companding grow stronger, the spectrum is sharpened and there is less interaction and interference amongst channels. Thus, the central portions of the spectrum suffer increasingly smaller amounts of attenuation. The results shown in FIG. 8 were obtained with $q_1=2.8$ and $q_2=4.5$. The interference effects are less pronounced when higher Q filters or fewer filters/octave are used. With zero-phase filters there is no interference and the magnitude transfer function shown in FIG. 8 with companding and without companding is almost identical and flat for all values of n.

Figure 9:
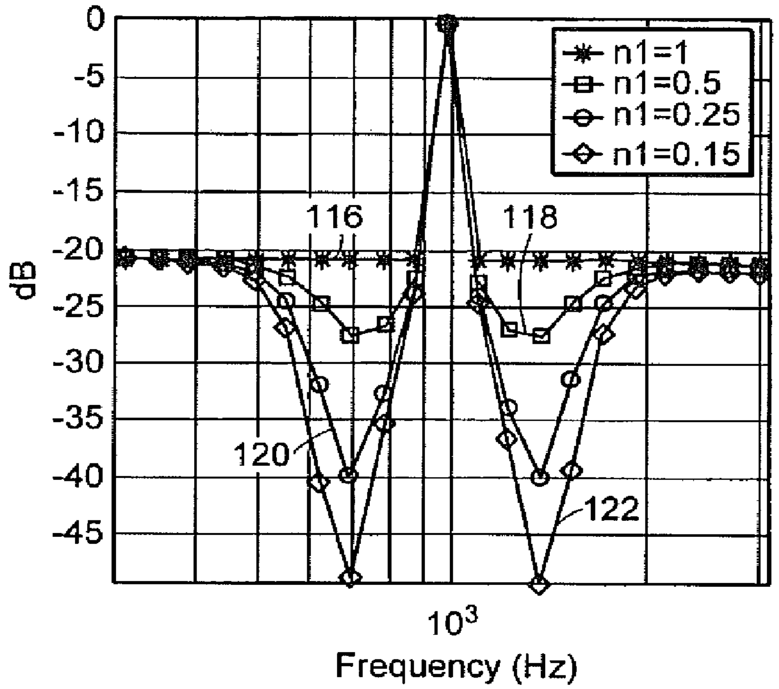
FIGS. 9-11 show illustrative diagrammatic graphical views of tone-to-tone suppression in various channels in accordance with further embodiments of the invention.
Figure 10:
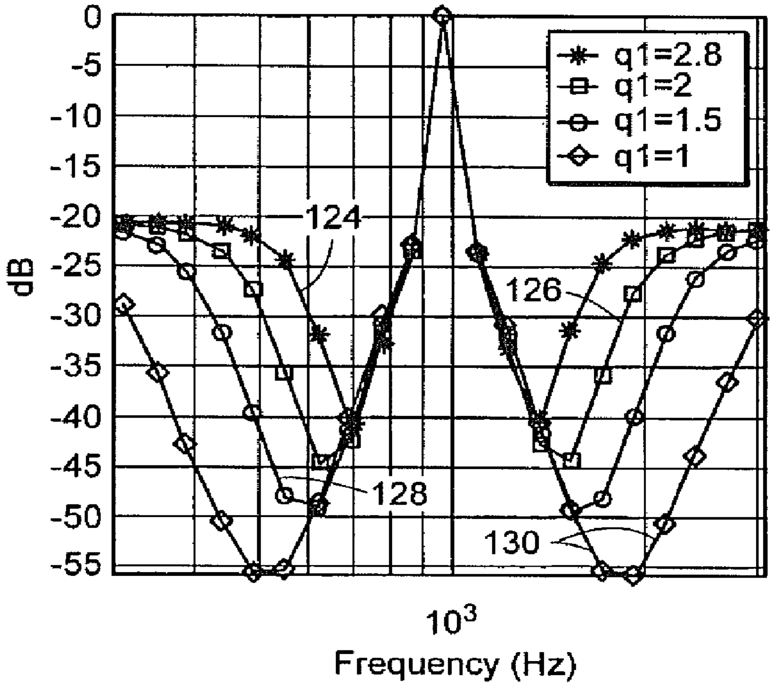
Figure 11:
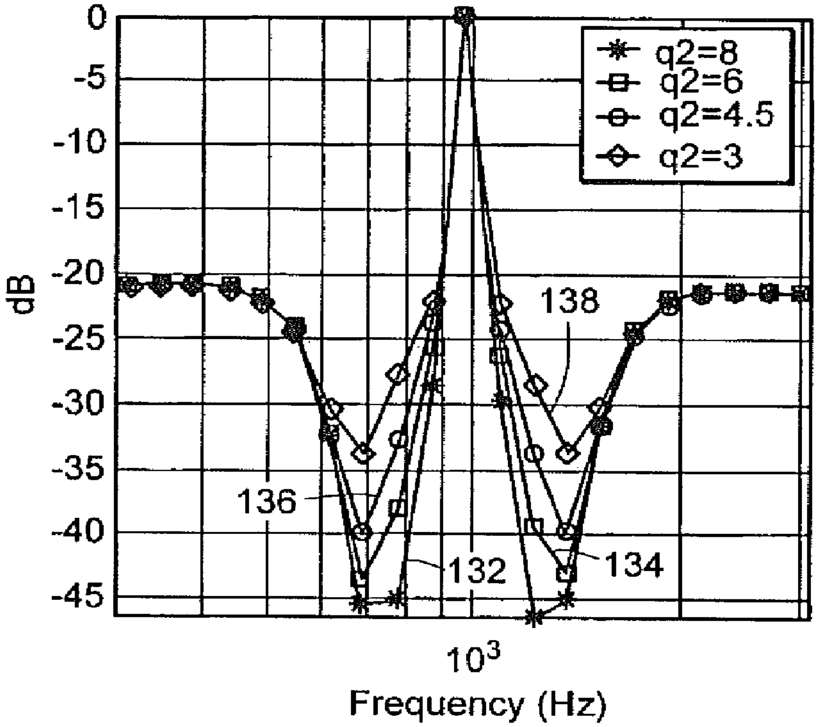

FIGS. 9, 10, and 11 reveal tone-to-tone suppression data for different values of $n_1$, $q_1$, (the Q of the F filters), and $q_2$ (the Q of the G filters) respectively. All experiments were performed by inputting a fixed 970 Hz sinusoid of amplitude $\alpha_2=0$ dB (the suppressor tone) and varying the frequency of a second sinusoid with fixed amplitude $\alpha_1=-20$ dB (the suppressed tone). The output plots the two-tone output spectrum after companding, which was extracted by performing a FFT on the final output of FIG. 2. The suppressor tone is invariant in all output spectra and results in a large spectral peak at 970 Hz in all plots. The suppressed tone strength varies in the output depending on how close in frequency it is to the suppressor and depending on the parameter settings of the companding architecture.

FIG. 9 shows tone-to-tone suppression in the entire system as the frequency of the suppressed $\alpha_1$ tone is varied for different values of $n_1$ ($n_1=1$, $n_1=0.5$, $n_1=0.25$ and $n_1=0.15$ as shown at 116, 118, 120 and 122 respectively). The suppressor tone is fixed at 970 Hz with an amplitude $\alpha_2=0$ dB. The suppressed tone has an amplitude $\alpha_1=-20$ db. The value of $n_2$ is 1 in all curves. The case $n_1=1$ corresponds to turning off the companding. The filters are created with $q_1=2.8$; $q_2=4.5$. The two-tone FFT of the companding architecture's output is plotted as the frequency of the suppressed tone varies. FIG. 9 shows that far from 970 Hz, the output amplitude of $\alpha_1$ is unchanged at −20 dB because the finite bandwidth of the F filter prevents suppression from happening at frequencies distant from 970 Hz. As the $\alpha_1$ tone frequency approaches 970 Hz, it is suppressed by the strong $\alpha_2$ tone and its output amplitude falls below −45 dB. When the $\alpha_1$ tone frequency is very close in frequency to the $\alpha_2$ tone, however, the G filter has similar gains to both tones and there is again no suppression. As $n_1$ is reduced, the suppression increases. At $n_1=1$, there is no companding or suppression.

FIG. 10 shows tone-to-tone suppression in the entire system as the frequency of the suppressed $\alpha_1$ tone is varied for different parameters of the F filter for $q_1=2.8$, $q_1=2$, $q_1=1$ and $q_1=1$ as shown at 124, 126, 128 and 130 respectively. The data is plotted as in FIG. 9 with $n_1=0.25$, $n_2=1$, $q_2=4.5$, $\alpha_1=-20$ dB, $\alpha_2=0$ dB and the fixed $\alpha_2$ tone at 970 Hz. As $q_2$ is decreased, broadening the F filter, the spatial extent and magnitude of the suppression are increased. As shown in FIG. 10, if the Q of the F filter as parametrized by $q_1$ is lowered, the extent of the suppression is more widespread in frequency; the suppression is also larger at any given frequency because the pre-filtered value of the suppressor tone (value after filtering by F) is larger and therefore more effective in causing suppression.

FIG. 11 shows tone-to-tone suppression in the entire system as the frequency of the suppressed $\alpha_1$ tone is varied for different parameters of the G filter for $q_2=8$, $q_2=6$, $q_2=4.5$ and $q_2=3$ as shown at 132, 134, 136 and 138 respectively. The data is plotted as in FIG. 9 with $n_1=0.25$, $n_2=1$, $q_1=2.8$, $\alpha_1=-20$ dB, $\alpha_2=0$ dB and the fixed $\alpha_2$ tone at 970 Hz. As $q_2$ is decreased, broadening the G filter, the spatial region where suppression is ineffective is broadened, and the magnitude of the suppression decreases in these regions as well. FIG. 11 shows that if the Q of the G filter as parametrized by $q_2$ is lowered, then the frequency region where the suppression is not effective is broadened; the suppression is also smaller at any given frequency because the G filter is less effective at removing the strong $\alpha_2$ tone, a necessary condition for having a small expansion gain and large suppression.

The masking curves are similar to the consequences of lateral inhibition used in speech enhancement. It is interesting to note that the masking is achieved without any lateral coupling between channels and without the use of inhibition.

Figure 12:
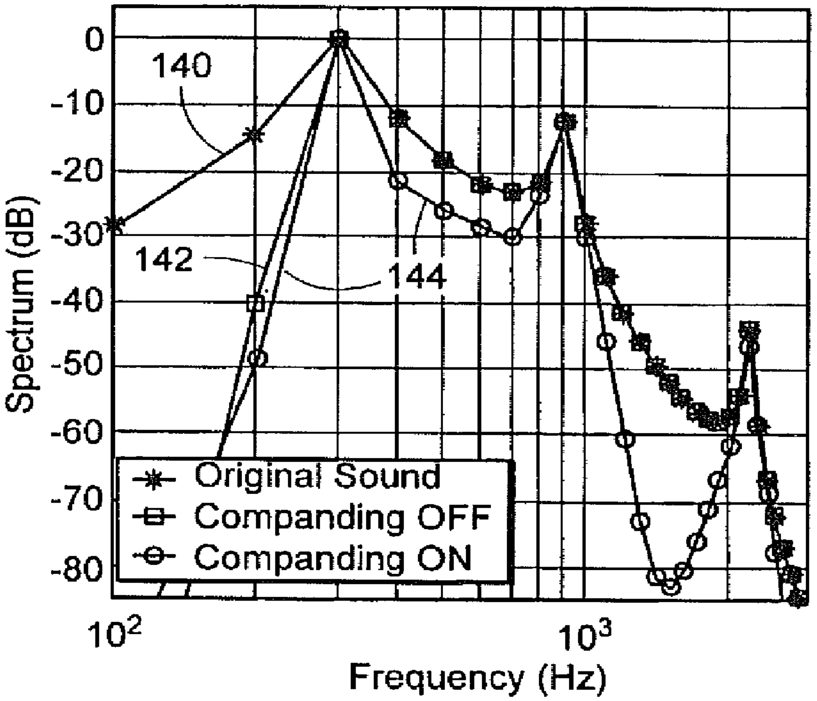
FIGS. 12-17 show illustrative diagrammatic graphical views of data obtained from a system in accordance with an embodiment of the invention.

FIGS. 12-15 illustrate data obtained from a companding architecture with a synthetic vowel/u/input. The asterisked trace of FIG. 12 shows that the pitch of the vowel input is at 100 Hz, the first formant is at 300 Hz, the second formant is at 900 Hz, and the third formant is at 2200 Hz. The spectral output of the companding architecture was extracted by performing an FFT. For clarity, the harmonics in the spectrum are joined with lines in the figures.

In particular FIG. 12 shows a spectrum of the output of the vowel/u/. The original sound is shown at 140. The companding-off case corresponds to $n_1=1$ and $n_2=1$ and is shown at 142. The companding-on case corresponds to $n_1=0.25$, and $n_2=1$ and is shown at 144. Zero-phase filters were used in both cases. FIG. 12 compares output spectra with the companding strategy on ($n_1=0.25$) and with the companding strategy off ($n_1$=1) for a zero-phase filter bank. The filter banks span a 300 Hz to 3500 Hz range and therefore attenuate some of the input energy at very tow frequencies. Apart from this low-frequency filtering, however, it may be observed that the no-companding strategy yields a faithful replica of the input and the companding strategy enhances the spectrum by suppressing harmonics near the formants.

Figure 13:
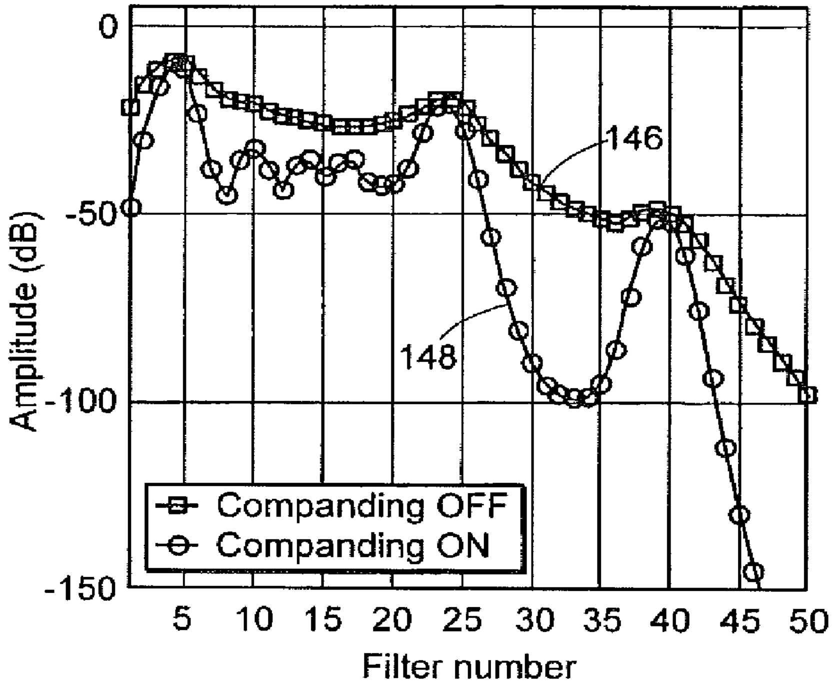

FIG. 13 shows maximum output of every channel versus filter number for the vowel input/u/. The companding-off case corresponds to $n_1$=1 and $n_2$=1 as shown at 146. The companding-on case corresponds to $n_1$=0.25 and $n_2$=1 as shown at 148. FIG. 13 plots the maximum output of every channel (summation is not performed) for the companding and no-companding strategies with zero-phase filter banks. The companding strategy sharpens the spectrum and enhances the formant structure. Using non-zero-phase fitters made little difference to the output of FIG. 13 for the companding-on strategy.

Figure 14:
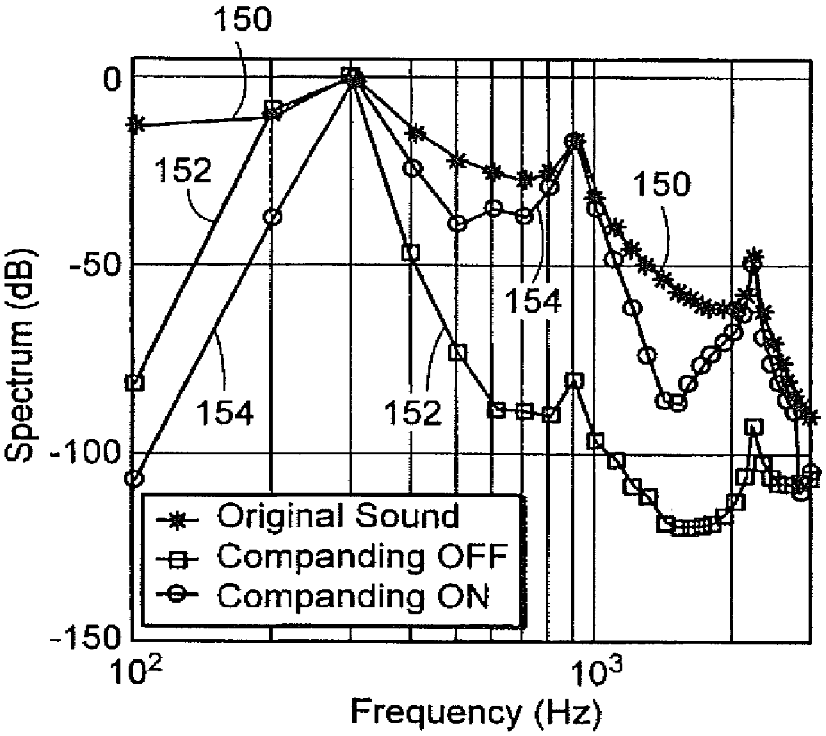

FIG. 14 shows a spectrum of the output of a vowel/u/. The original sound is shown at 150. The companding-off case corresponds to $n_1$=1 and $n_2$=1 as shown at 152. The companding-on case corresponds to $n_1$=0.25 and $n_2$=1 as shown at 154. No zero-phase filters were used in either case. FIG. 14 shows that if zero-phase filter banks are not used, the companding-off strategy results in a strong attenuation of the vowel spectrum due to interference amongst channels. There is less attenuation at the borders of the spectrum due to reduced interference at the edges of the filter bank. In contrast, the companding-on strategy yields an output spectrum that is almost identical to that obtained with zero-phase filters (FIG. 12) because of its immunity to intereference amongst channels.

Figure 15:
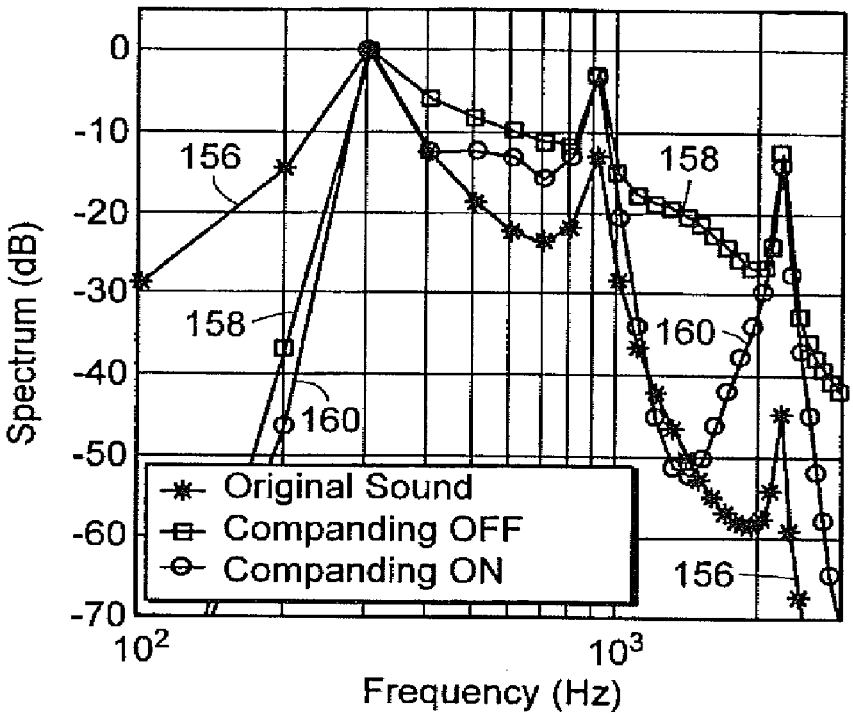

FIG. 15 also shows a pectrum of the output of a vowel/u/. The original sound is shown at 156. The companding-off case corresponds to $n_1$=1 and $n_2$=0.3 and is shown at 158. The companding-on case corresponds to $n_1$=0.08 and $n_2$=0.25 as shown at 160. Zero-phase filters were used in both cases. FIG. 15 shows that the companding architecture performs multi-channel syllabic compression of the sound without flattening the spectrum and reducing spectral contrast: In the figure, we compare the results of compression without companding ($n_1$=1, $n_2$=0.3) with the results of companding ($n_1$=0.08, $n_2$=0.25). The numbers were chosen to have formant peaks with the same amplitude in both cases. We see that compression alone degrades spectral contrast but companding is capable of compression while preserving good contrast in the spectrum.

It is possible to architect filter shapes and choose parameters to mimic auditory system or auditory nerve behavior. The masking extent for each channel could be customized by having different F filters for each channel. It may be advantageous to have more masking of low-frequency tones by high-frequency tones such that the low-frequency formant does not create excessive suppression of higher frequencies in the damage-impaired cochlea.

Figure 16:
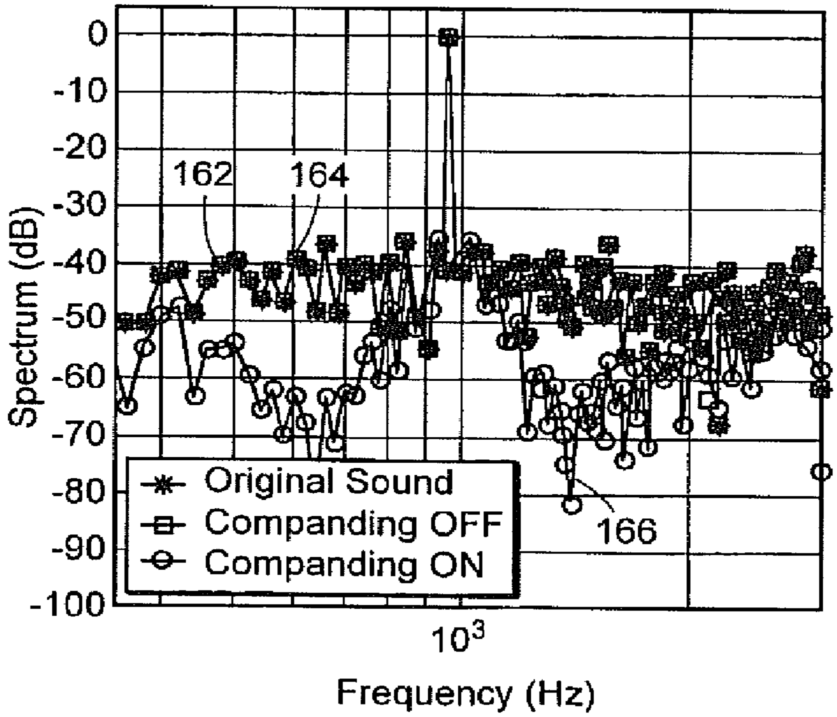
Figure 17:
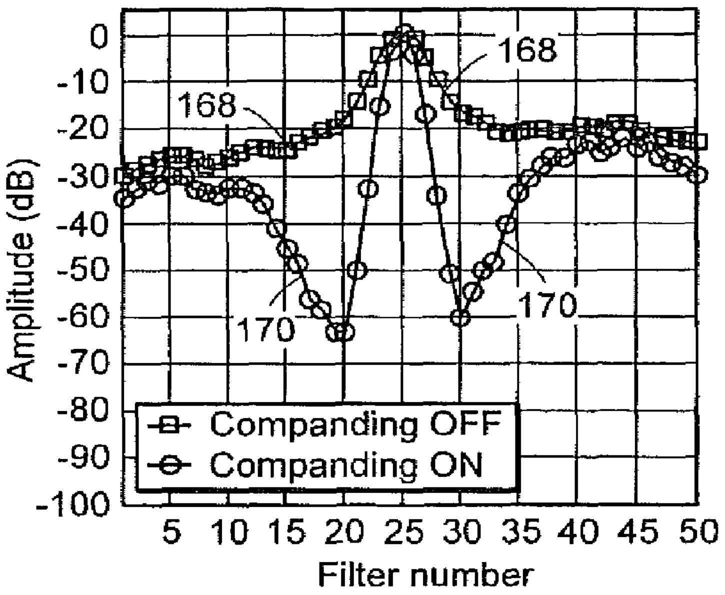

FIGS. 16 and 17 illustrate the effects of noise suppression in the companding architecture: The input to the architecture is a 970 Hz sinusoid amidst Gaussian white noise. The output and input spectra extracted via FFT operations are shown in FIG. 16, which shows the output spectrum of a 970 Hz sinusoid amidst Gaussian white noise. The original sound is shown at 162, the companding-off case is shown at 164 and the companding-on case is shown at 166. The suppression of the noise around the tone is evident. The original sound's spectrum is identical to the spectrum observed in the companding-off case. The tone suppresses the noise in regions of the spectrum near it. FIG. 17 plots the maximum output of every channel (in 250 ms) versus channel number for the input of FIG. 16, i.e. a sine tone in noise where the companding-off case is shown at 168 and the companding-on case is shown at 170. Companding suppresses the effects of channels near the strongest channel.

A companding architecture of an embodiment of the invention may be used to perform nonlinear spectral analysis if we omit the final summation operation at the end of FIG. 2. The local winner-take-all properties of the architecture then enhance the peaks in the spectrum just like tone-to-tone suppression and lateral inhibition in the auditory system. Some potential uses of such companded spectra for cochlear-implant processing and speech-recognition front ends are as follows.

Strategies called N-of-M strategies in cochlear-implant processing pick only those M channels with the largest spectral energies amongst a set of N channels for electrode stimulation. A companding architecture of an embodiment of the invention naturally enhances channels with spectral energies significantly above their surround and suppresses weak channels. Effectively we can create an analog N-of-M-like strategy without making any explicit decisions or completely shutting off weak channels.

The companding strategy could thus preserve more information and degrade more gracefully in low signal-to-noise environments than the N-of-M strategy. Given that improving patient performance in noise is one of the key unsolved problems in cochlear implants, companding spectra could yield a useful spectral representation for implant processing. The effects of compression and masking can be modeled in an intertwined fashion as in the biological cochlea and customized to each patient. The parameter $n_2$ will always be between 0 and 1 in this application because we need to compress the wide dynamic range of input sounds to the limited electrode dynamic range of the patient. The architecture requires filters of modest Q and relatively low order and is amenable to very low power analog VLSI implementations.

Figure 18A:
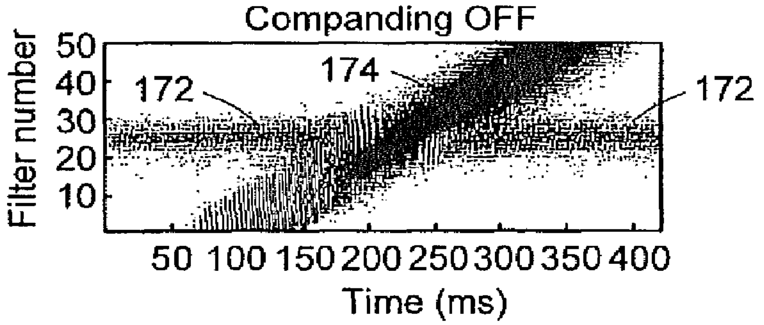
FIGS. 18A-18B show illustrative diagrammatic graphical representations of tone-to-tone suppression for systems with an without spectral enhancement in accordance with an embodiment of the invention.
Figure 18B:
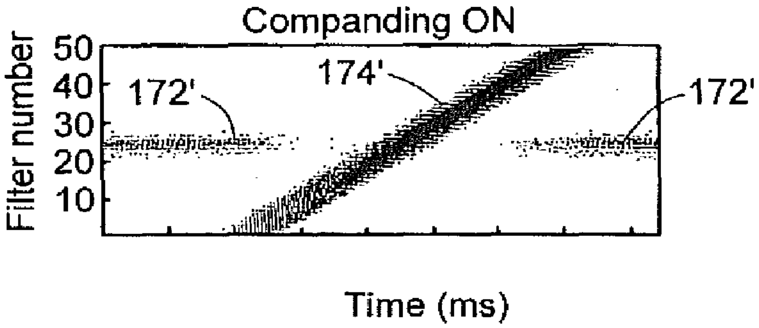

FIGS. 18A, 18B, 19A and 19B show the evolution in time of the channel outputs of FIG. 2 right before the final summation point for two inputs. The positive signals are shown in dark black. Fifty logarithmically spaced channels between 300 Hz and 3500 Hz with $q_1$=1.5, $q_2$=4.5, $n_1$=0.3, $n_2$=1, and w=10. Effectively, FIGS. 18A-19B are spectrogram-like plots for companding spectra. In these plots, we used $F_i(s)=G_i(s)=G_i'(s)$, and first-order low-pass filter in the envelope detector. FIGS. 18A and 18B show tone-to-tone suppression: In FIG. 18A the companding strategy is disabled ($n_1$=1), and in FIG. 18B the companding strategy is active ($n_1$=0.3). In the experiment illustrated by FIGS. 18A and 18B, the input consists of a fixed tone at 1000 Hz with an amplitude that is ⅕ the amplitude of a logarithmically chirped tone. The chirp suppresses the background weak tone when its frequency is near that of the tone and companding is on ($n_1$=0.3). FIG. 18A shows that the background weak tone (172) is confounded with the chirp (174) when there is no companding ($n_1$=1). As shown in FIG. 18B, the suppressed input is the sinusoid at 1000 Hz (as shown at 172') and the suppressor is the logarithmic chirp with an amplitude 5 times that of the tone (as shown at 174'). As discussed above, the amount and extent of suppression may be varied by altering compression or filter parameters. Note also that when companding is on, the overall response is sharper due to fewer channels being active.

Figure 19A:
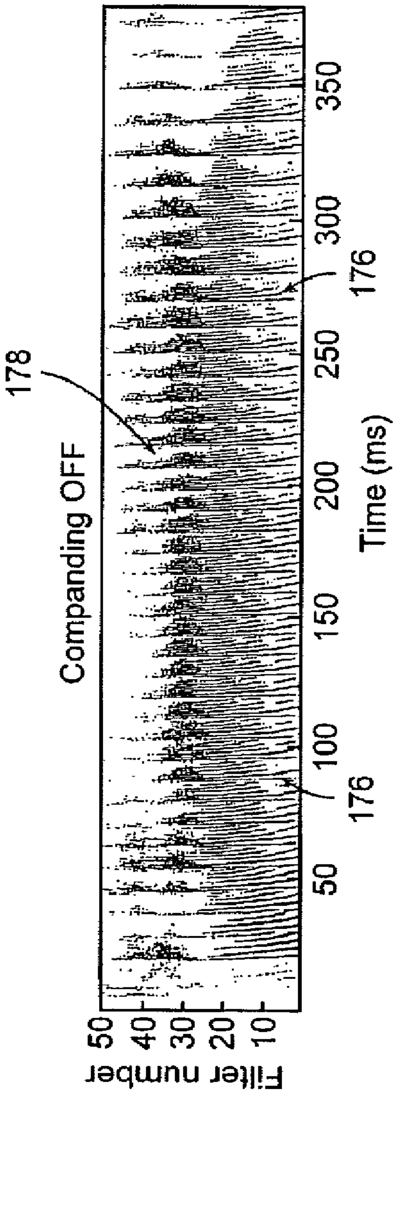
FIGS. 19A-19B show illustrative diagrammatic graphical representations of tone-to-tone suppression for systems with an without spectral enhancement in accordance with another embodiment of the invention
Figure 19B:
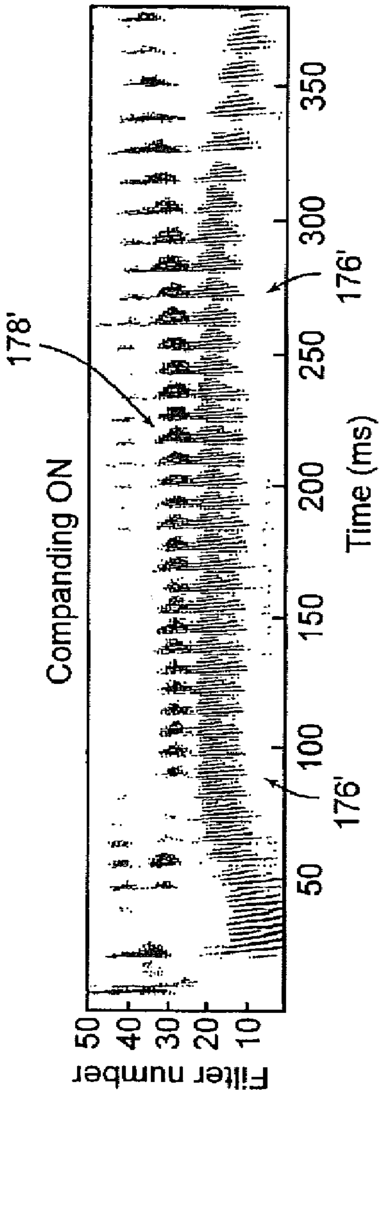

FIGS. 19A and 19B show spectrogram-like plots for the word "die" illustrating the clarifying effect of companding. In FIG. 19A the companding strategy is disabled ($n_1$=1) and in FIG. 19B, the companding strategy is active (n1=0.3). In the experiment illustrated in FIGS. 19A and 19B, the input is intentionally a low-quality rendition of the word "die" with two formant transitions. FIG. 19B shows that, in the absence of companding, the formant transitions (176) lie buried in an environment (178) with lots of active channels and lack clarity. In contrast, FIG. 19A shows that the companding architecture is able to follow the follow the formant transitions (as shown at 176') with clarity and suppress the surrounding clutter (as shown at 178').

The use of automatic gain control strategies for modeling forward masking in filter-bank front ends for automatic speech recognition (ASR) has been shown to be important in noisy environments. A companding architecture of an embodiment of the invention adds simultaneous masking through nonlinear interactions to achieve compression without degrading spectral contrast. Thus, it offers promise for speech-recognition front ends in noisy environments. The architecture is also very amenable to low power analog VLSI implementations, which are important for portable speech recognizers of the future.

Such a companding architecture, therefore, performs multi-channel syllabic compression without degrading local spectral contrast due to the presence of masking. The masking arises from implicit nonlinear interactions in the architecture and is not explicitly due to any interactions between channels. The compression and masking properties of the architecture may easily be altered by changing filter shapes and compression and expansion parameters. Due to its simplicity, its ease of programmability, its modest requirements on filter Q's and filter order, its ability to suppress interference effects when channels are combined, and its ability to clarify noisy spectra, the architecture is useful for hearing aids, cochlear-implant processing, and speech-recognition front ends. In effect, a nonlinear spectral analysis may be performed generating a companding spectrum. The architectural ideas are general and apply to all forms of spectral analysis, e.g., in sonar, radar, RF, or image applications. The architecture is suited to low power analog VLSI implementations.

In another experiment NMR signals were analyzed from a sample of Regular COCA-COLA and a sample of DIET COCA-COLA sold by Coca Cola Company of Atlanta, Ga.

Figure 20:
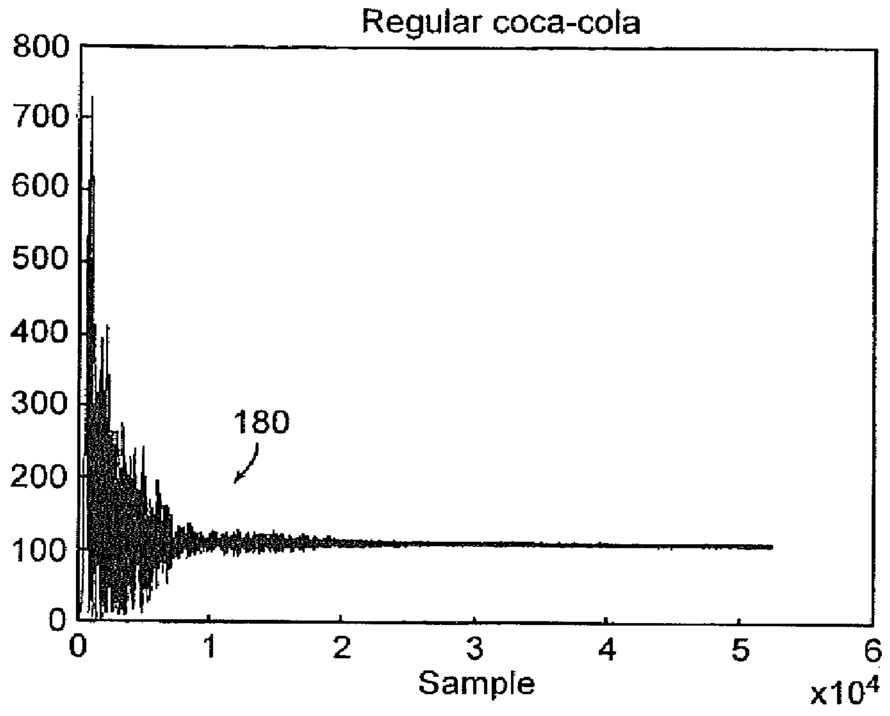
FIGS. 20-21 show illustrative diagrammatic NMR data for two samples for use in an embodiment of the invention.
Figure 21:
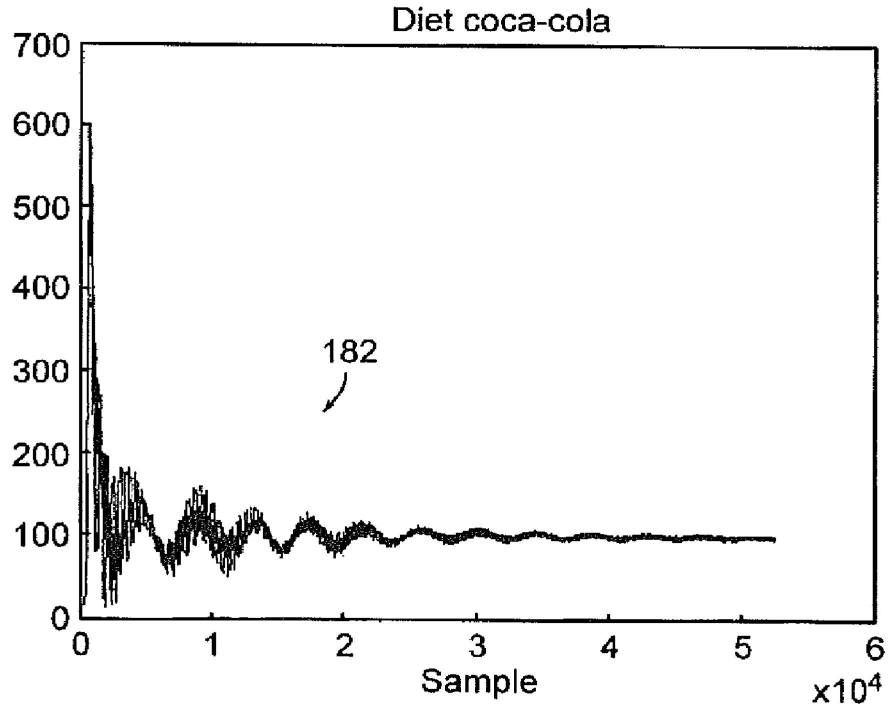
Figure 22:
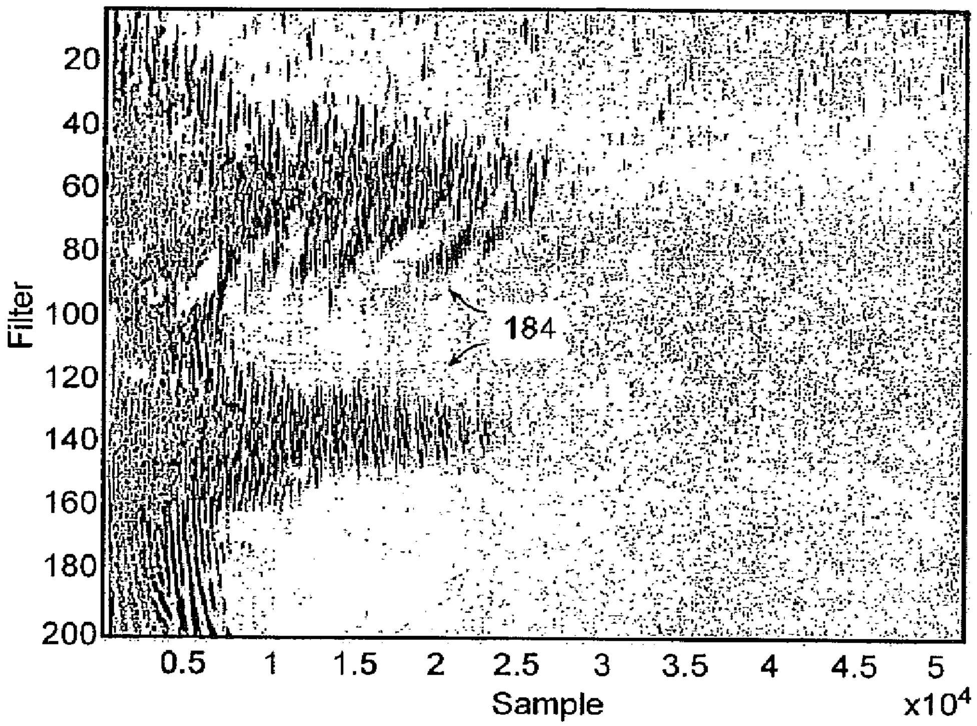
FIGS. 22 and 23 show illustrative diagrammatic graphical representations of the output of a system in accordance with an embodiment of the invention for the sample of FIG. 20 with the spectral enhancement system of the invention on and off respectively.
Figure 23:
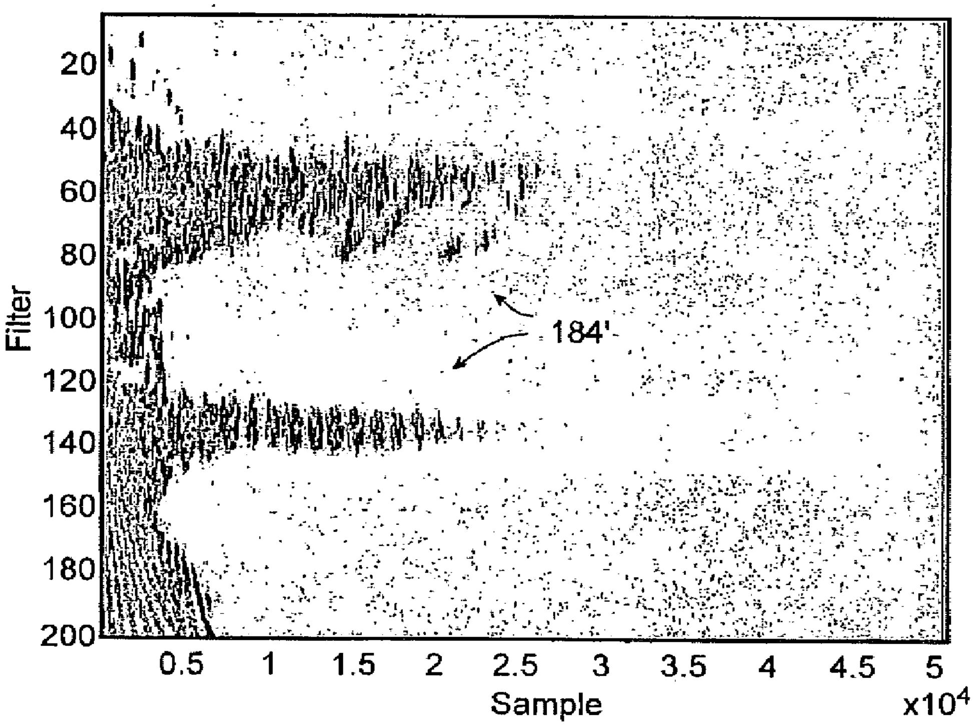
Figure 24:
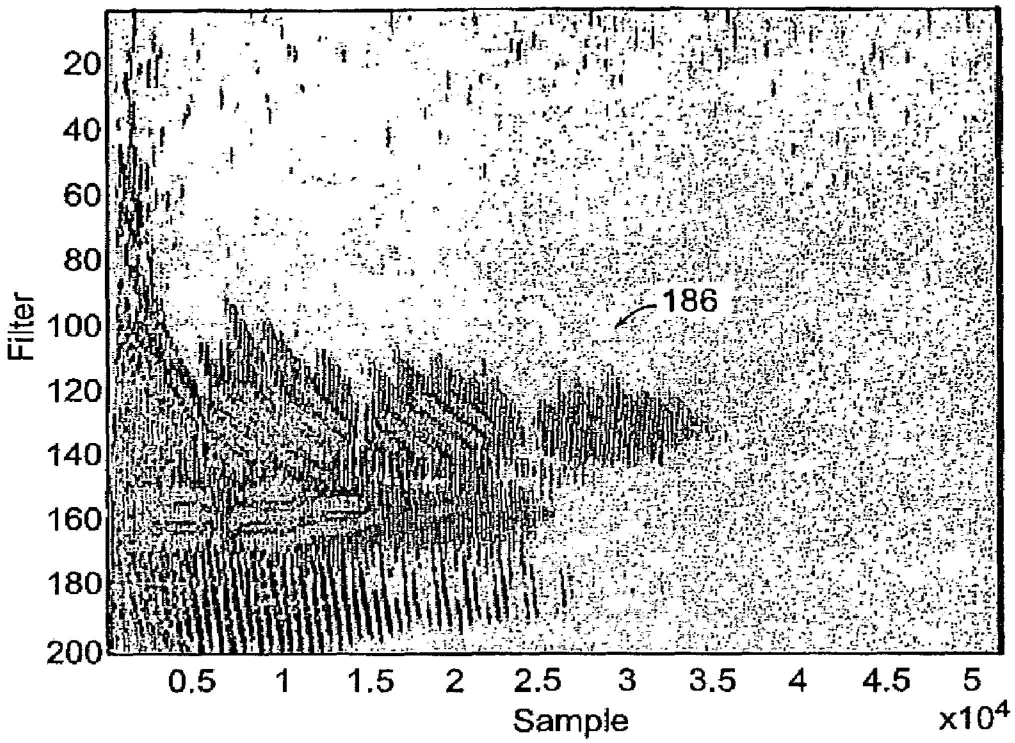
FIGS. 24 and 25 show illustrative diagrammatic graphical representations of the output of a system in accordance with an embodiment of the invention for the sample of FIG. 21 with the spectral enhancement system of the invention on and off respectively.
Figure 25:
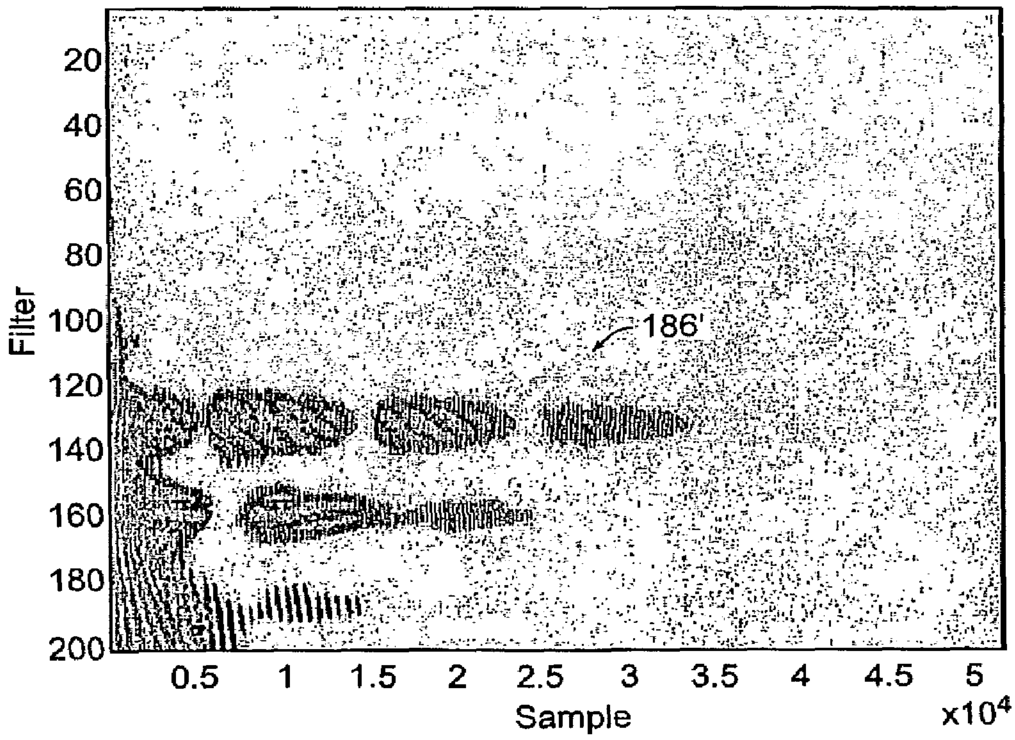

The samples differed in the presence of sucrose. FIGS. 20 and 21 show the evolution in time of the NMR data of the COCA-COLA and DIET COCA-COLA samples at 180 and 182 respectively. FIG. 22 shows at 184 the channel outputs for the COCA-COLA sample with companding off, and FIG. 23 shows at 184' the channel outputs for the COCA-COLA sample with companding on. FIG. 24 shows at 186 the channel outputs for the DIET COCA-COLA sample with companding off, and FIG. 25 shows at 186' the channel outputs for the DIET COCA-COLA sample with companding on. Two hundred logarithmically spaced channels were used between 12 Hz and 2500 Hz with $q_1=1.5$, $q_2=4.5$, $n_1=0.3$, $n_2=1$, and $w=10$. Effectively, FIGS. 22-25 are spectrogram-like plots for companding spectra. In these plots, the topology discussed above was implemented with: $F_i(s)=F_i'(s)$, $G_i(s)=G_i'(s)$, and first-order low-pass filter in the envelope detector. In the experiment illustrated by FIGS. 22 and 23, the input is shown in FIG. 20. In the experiment illustrated by FIGS. 24 and 25, the input is shown in FIG. 21. FIGS. 23 and 25 show that the companding architecture is able to follow the transitions with clarity and suppress the surrounding clutter. In contrast, FIGS. 22 and 24 show that, in the absence of companding, the transitions lie buried in an environment with lots of active channels and lack clarity.

Figure 26:
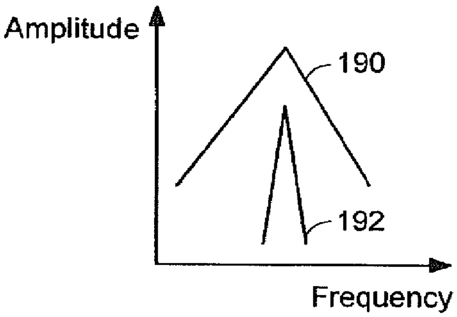
FIG. 26 shows an illustrative diagrammatic view of a non-linear filter for use in a system in accordance with an embodiment of the invention.

In further embodiments some, of the F and/or G linear filters may be substituted with nonlinear filters. Filters that change the Q can make the system more similar to the signal processing present in the human auditory system (e.g., the masking profile changes in function of the loudness of the system). This kind of filter automatically performs a compression or an expansion, for this reason a separate compression-expansion block may not be necessary. FIG. 26 shows an example of a nonlinear filter that mimics the cochlear behavior. For loud signals the filter is broad (as shown at 190) on the contrary for small signals the filter is sharp (as shown at 192).

Compression and/or expansion blocks may be substituted with a nonlinear function with saturating or compressing properties (e.g. sigmoid) without loosing the general properties of the system. The distortion introduced by the nonlinear compression is not a problem because much of it is removed by the second filter.

Figure 27:
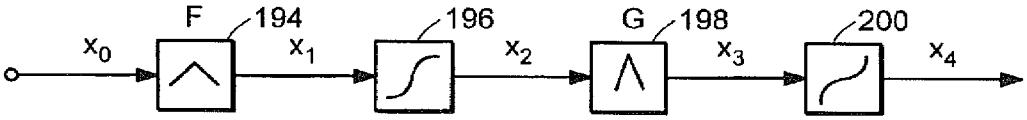
FIG. 27 shows an illustrative schematic view of a single channel of processing in a system in accordance with an embodiment of the invention.

FIG. 27 shows a detailed view of a single channel of processing of a system that may be similar to that shown in FIG. 2. As shown, the channel includes a first non-linear filter 194, a compression unit 196, a second non-linear filter 198 and an expansion unit 200. Both the compression and expansion blocks are substituted with instantaneous blocks.

Directionality may be added to a two detector system in accordance with a further embodiment of the invention. Channel suppression is regulated using a coincidence detector comparing zero-crossings in the corresponding channels of the two systems. The coincidence detector is a system that measures the phase between two signals. The output of the coincidence detector may be fed to the suppression circuitry through any of a variety of standard control functions such as proportion (P), proportional-integral (PI), and proportional-integral-differential (PID). Signals that reach the two detectors at the same time (e.g., a speaker directly in front of a listener) will receive a strong response from the coincidence detector in its active bands. The system can then decrease the suppression in those channels. A signal which reaches the two detectors at different times (e.g. a noise source to the side of the listener) will not trigger the strong response from the coincidence detector. Its frequency bands will be suppressed.

Figure 28:
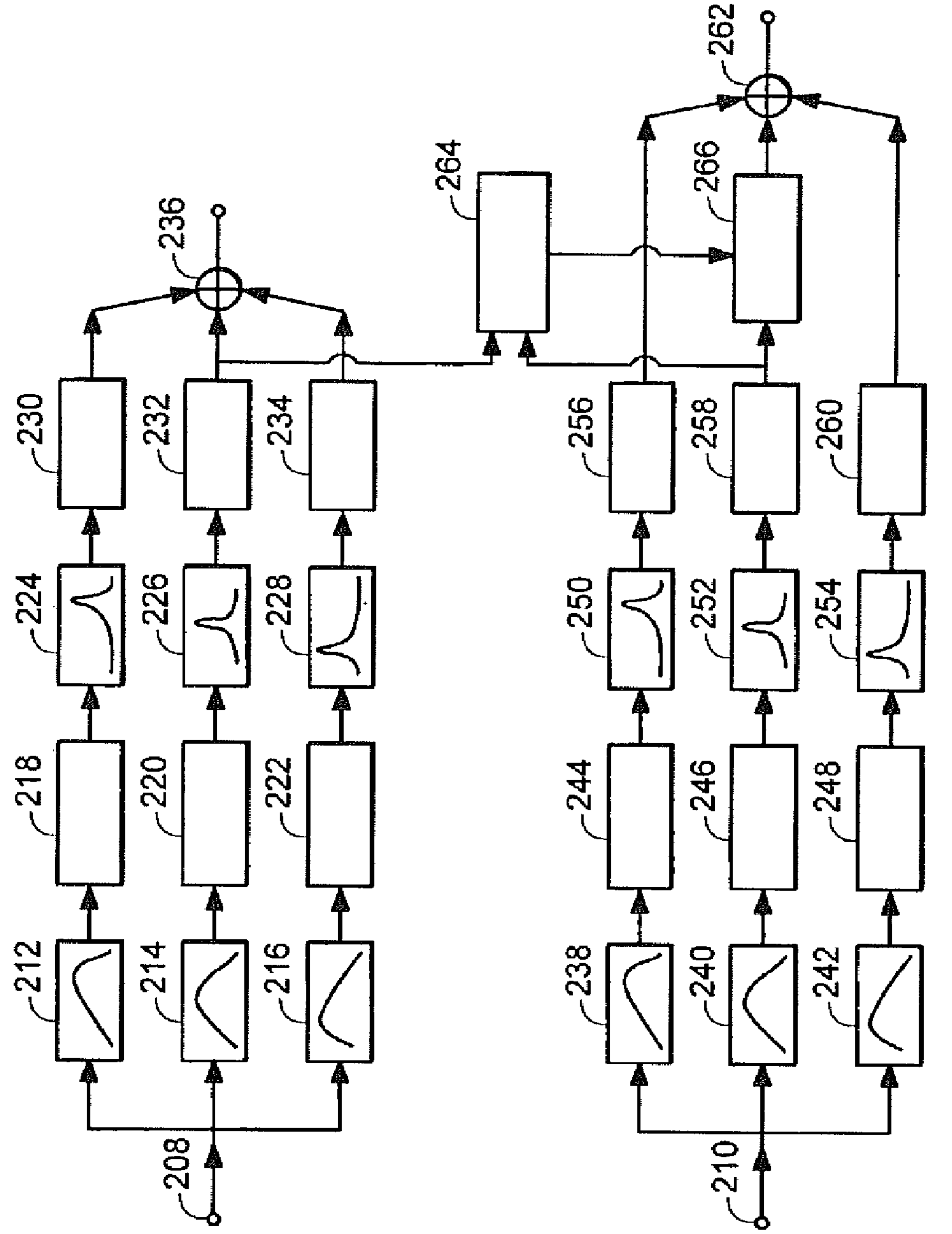
FIG. 28 shows an illustrative diagrammatic view of a system in accordance with a further embodiment of the invention.

FIG. 28 shows an example of double companding architectures for directional selectivity. The suppressing strategy is shown in only one channel, but it could be implemented in some or all of the remaining channels. As shown in FIG. 28, a double companding system may include two companding architectures that each receives a directionally different inputs at nodes 208 and 210. The input from node 208 is received by a first set of band pass filters 212, 214 and 216 respectively. The outputs of the band pass filters are received at compression units 218, 220 and 222 respectively, and the outputs of the compression units are received at a second set of band pass filters 224, 226 and 228 respectively. The outputs of the second set of band pass filters 224-228 are received at expansion units 230, 232 and 234 respectively, and the outputs of the expansion units 230-234 are combined at combiner 236

The input from node 210 is also received by a first set of band pass filters 238, 240 and 242 respectively. The outputs of the band pass filters are received at compression units 244, 246 and 248 respectively, and the outputs of the compression units are received at a second set of band pass filters 250, 252 and 254 respectively. The outputs of the second set of band pass filters 250-254 are received at expansion units 256, 258 and 260 respectively, and the outputs of the expansion units 256-260 are coupled to a second combiner 262.

Figure 29:
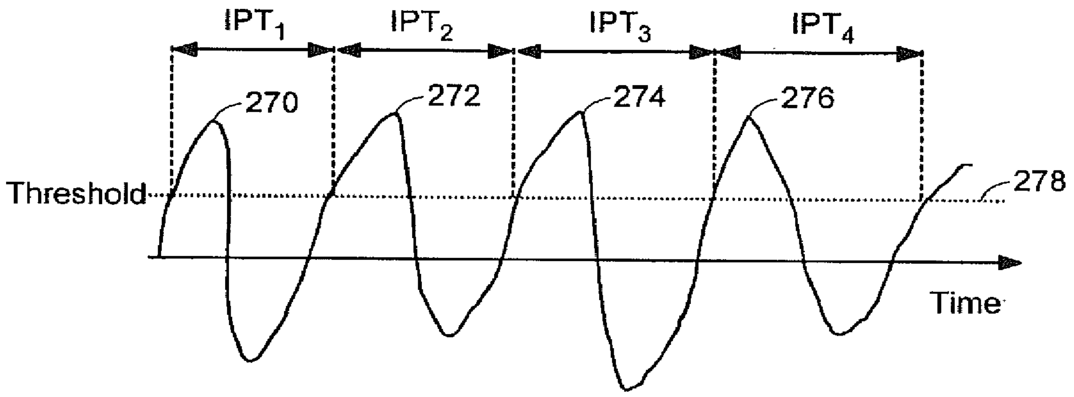
FIG. 29 shows an illustrative diagrammatic view of an inter-peak time filter for use in a system in accordance with a further embodiment of the invention The drawings are shown for illustrative purposes and are not to scale.

One of the channels from each architecture may be compared and the comparison may be employed to adjust a further suppression of one channel. For example, the output of the expansion unit 232 and the output of the expansion unit 258 may be compared with one another at a coincidence detector 264, and the output of the coincidence detector 264 may be used to adjust a suppression unit 266 that is interposed between the output of the expansion unit 258 and the combiner 262 as shown in FIG. 29. By employing such a system, directional selectivity may be employed to further suppress background noise in an embodiment of a system of the invention.

In further embodiments, some filters present in the companding architecture may be substituted with an inter-peak time filter or a multi-inter-peak time filter. Alternatively, these filters may be added at the end of some channels. The inter-peak time filter suppresses or attenuate its output when the IPT (inter-peak time: time between two consecutive upward-going level crossings) is far from the $1/F_r$ of that particular channel ($F_r$=resonant frequency of the 2 filters present in one channel of the companding architecture). The multi-inter-peak time filter suppresses or attenuate its output when (1) each IPT (or a determined statistic) is far from the $1/F_r$ in the selected cluster of events, or (2) each IPT (or a determined statistic) far from the mean IPT computed in the cluster of events. These two conditions may be applied together or alone.

For example, FIG. 29 shows a succession of IPTs (e.g., $IPT_1$, $IPT_2$, $IPT_3$, $IPT_4$) occur for a cluster of events between peaks 270, 272, 274 and 276, which are each above a threshold 278. The selection criteria may be a function of time (e.g., the channel is more or less suppressed if the condition described before persist for a while).

Those skilled in the art will appreciate that numerous modifications and variations may be made to the above disclosed embodiments without departing from the spirit and scope of the invention.

What is claimed is:

1. A spectral enhancement system comprising:

an input node for receiving an input signal; and a first signal channel for processing the input signal and for providing to an output node a first channel output signal that is within a first channel frequency band, said output node providing an output signal that is spectrally enhanced as compared to the input signal, said first signal channel comprising:

a first temporal broad band pass filter coupled to said input node and having a first broad band pass range that is wider than the first channel frequency band of the first signal channel, said temporal first broad band pass filter providing a first broad band pass filtered signal;

a first compression circuit coupled to said first temporal broad band pass filter for detecting a first envelope of the input signal within the first broad band pass range, and for non-linearly mapping the first broad band pass filtered signal by a first non-linear factor;

a first temporal narrow band pass filter coupled to said first compression circuit and having a first narrow band pass range that is narrower than said first broad band pass range and providing a first narrow band pass filter signal, said first narrow band pass range being the same as the first channel frequency band of the first signal channel; and a first expansion circuit coupled to said temporal first narrow band pass filter for performing an expansion function of said first narrow band pass filtered signal, said expansion circuit includes a first detecting element to detect one or more non-linear factors of the input signal within the first narrow band pass range in said first temporal narrow band pass filter and uses said first non-linear factor and a second non-linear factor to perform said expansion function.

2. The system as in claim 1, wherein said first temporal narrow band pass filter is implemented as an inter-peak time filter.

3. The system as in claim 1, wherein said first narrow temporal band pass filter is implemented as a multi-inter-peak time filter.

4. The system as in claim 1, wherein said first compression circuit is directly connected to the first temporal broad band pass filter, said temporal first narrow band pass filter is directly connected to said first non-linear circuit.

5. The system as in claim 1, wherein said compression circuit is combined with said first temporal narrow band pass filter within a non-linear filter unit.

6. The system as in claim 1, wherein said first compression circuit and said first expansion circuit have a time constant of adaptation.

7. The system as in claim 1, wherein said compression circuit operates instantaneously.

8. The system as claimed in claim 1, wherein said system further includes a second signal channel for processing the input signal and for providing to the output node a second channel output signal that is within a second channel frequency band.

9. The system as claimed in claim 8, wherein said second signal channel comprises:

a second temporal broad band pass filter coupled to said input node and having a second band pass range that is wider than the second channel frequency band of the second signal channel, said second temporal broad band pass filter providing a second broad band pass filtered signal;

a second compression circuit coupled to said second temporal broad band pass filter for detecting a second envelope of the input signal within the second band pass range, and for non-linearly mapping the second broad band pass filtered signal by a first non-linear factor;

a second temporal narrow band pass filter coupled to said second non-linear circuit and having a second narrow band pass range that is narrower than said second band pass range, said second narrow band pass range being the same as the second channel frequency band of the second signal channel; and a second expansion circuit coupled to said second temporal narrow band pass filter for performing a syllabic compression or an expansion function of said first narrow band pass filtered signal, said second expansion circuit includes a second detecting element to govern the dynamics of the syllabic compression and expansion of the input signal within the second narrow band pass range in said second temporal narrow band pass filter, said second expansion circuit uses said first non-linear factor and said second non-linear factor to perform either the syllabic compression function or said expansion function.

10. The system as claimed in claim 1, wherein said output node is coupled to a hearing aid.

11. The system as claimed in claim 1, wherein said output node is coupled to a cochlear implant.

12. The system as claimed in claim 1, wherein said system includes a plurality of output nodes for providing a plurality of output signals in a binaural hearing system.

13. A spectral enhancement system comprising:

an input node for receiving an input signal; and a plurality of signal channels for processing the input signal, each of the plurality of signal channels providing to an output node a channel output signal that is within a channel frequency band for that channel, wherein each said signal channel comprises:

a temporal broad band pass filter coupled to said input node and having a broad band pass range that is wider than the associated channel frequency band, said temporal broad band pass filter providing a broad band pass filtered signal;

a first non-linear circuit coupled to said temporal broad band pass filter for non-linearly mapping the broad band pass filtered signal by a first non-linear factor $n_1$ by detecting one or more selective characteristics of the input signal within the first broad, band pass range;

a temporal narrow band pass filter coupled to said non-liner circuit and having a narrow band pass range, said narrow band pass range being the same as the channel frequency band of the associated signal channel; and a second non-linear circuit coupled to said temporal narrow band pass filter for non-linearly mapping a narrow band pass filtered signal using first non-linear factor $n_1$ and a second non-linear factor $n_2$ by governing the dynamics of syllabic compression and expansion of the input signal within the first narrow band pass range.

14. The system as claimed in claim 13, wherein said first non-linear circuit provides a compression function for compressing the broad band pass filtered signal.

15. The system as claimed in claim 14, wherein said second non-linear circuit provides an expression function for expanding the narrow band pass filtered signal.

16. The system as claimed in claim 13, wherein said system further includes at least one additional temporal band pass filter coupled to said second non-linear circuit and to said output node.

17. The system as claimed in claim 13, wherein said temporal narrow band pass filter is implemented as an inter-peak time filter.

18. The system as claimed in claim 13, wherein said temporal narrow band pass filter is implemented as a multi-inter-peak time filter.

19. The system as claimed in claim 13, wherein said first non-linear circuit is directly connected to the temporal broad band pass filter, said temporal narrow band pass filter is directly connected to said first non-linear circuit.

20. The system as claimed in claim 13, wherein said temporal broad band pass filter is combined with said first non-linear circuit within a non-linear filter unit.

21. The system as claimed in claim 13, wherein said first non-linear circuit is combined with said temporal narrow band pass filter within a non-linear filter unit.

22. The system as claimed in claim 13, wherein said second non-linear circuit is combined with said temporal narrow band pass filter within a non-linear filter unit.

23. The system as claimed in claim 13, wherein said first non-linear circuit has a time constant of adaptation.

24. The system as claimed in claim 13, wherein said first non-linear circuit operates instantaneously.

25. The system as claimed in claim 13, wherein said second non-linear circuit has a time constant of adaptation.

26. The system as claimed in claim 13, wherein said second non-linear circuit operates instantaneously.

27. The system as claimed in claim 13, wherein said output node is coupled to a hearing aid.

28. The system, as claimed in claim 13, wherein said output node is coupled to a combiner.

29. The system as claimed in claim 13, wherein said system includes a plurality of output nodes for providing a plurality of output signals in a binaural hearing system.

30. A method of providing spectral enhancement, said method comprising the steps of:

receiving an input signal in a signal channel for processing the input signal and for providing to an output node, a first channel output signal that is within a first channel frequency band, said output node providing an output signal that is spectrally enhanced as compared to the input signal;

coupling said input signal to a temporal broad band pass filter within the signal channel having a broad band pass range that is wider than the first channel frequency band;

coupling said temporal broad band pass filter to a non-linear circuit for non-linearly mapping a broad band pass filtered signal by a non-linear factor n;

coupling said non-linear circuit to a temporal narrow band pass filter having a narrow band pass range that is narrower than said first band pass range; and providing the first channel output signal that is spectrally enhanced at an output node that is coupled to said temporal narrow band pass filter.

31. The method as claimed in claim 30, wherein said non-linear circuit provides a compression function for compressing the broad band pass filtered signal.

32. The method as claimed in claim 30, wherein said non-linear circuit provides an expansion function for expanding the broad band pass filtered signal.

33. A method of providing spectral enhancement, said method comprising the steps of:

receiving an input signal at an input node that is coupled to a signal channel or processing the input signal and for providing to an output node a first channel output signal that is within a first channel frequency band, said output node providing an output signal that is spectrally enhanced as compared to the input signal;

coupling said input node to at least one temporal broad band pass filter within the first signal channel having a first band pass range that is wider than the first channel frequency;

coupling said at least one temporal broad band pass filter to a first non-linear circuit for non-linearly mapping a broad band pass filtered signal by a first non-linear factor $n_1$;

coupling said first non-linear circuit to a temporal narrow band pass filter having a narrow band pass range that is narrower than said broad band pass range;

coupling said temporal narrow band pass filter to a second non-linear circuit for non-linearly mapping a narrow baud pass filtered signal using said first non-linear factor $n_1$ and a second non-linear factor $n_2$ by governing the dynamics of syllabic compression and expansion of the input signal within the narrow band pass range; and providing an output signal that is spectrally enhanced to an output node that is coupled to said temporal narrow band pass filter.

34. The method as claimed in claim 33, wherein said first non-linear circuit provides a compression function for compressing the first band pass filtered signal.

35. The method as claimed in claim 33, wherein said second non-linear circuit provides an expression function for expanding the second band pass filtered signal.

36. The method as claimed in claim 33, wherein said method further includes the step of coupling at least one additional temporal band pass filter to said second non-linear circuit and to said output node.

37. A method of providing spectral enhancement, said method comprising the steps of:

receiving an input signal in a plurality of signal channels, each of which processes the input signal and provides to an output node a channel output signal that is within a different channel frequency band;

coupling said input signal to a temporal broad band pass filter within each signal channel, each temporal broad band pass filter having a broad band pass range that is wider than the channel frequency band for that channel;

coupling each said temporal broad band pass filter to a mapping circuit for detecting an envelope of the input signal and for mapping a broad band pass filtered signal by a first factor n;

coupling said mapping circuit to a temporal narrow band pass filter having a narrow band pass range that is narrower than said broad band pass range for the associated channel;

coupling said temporal narrow band pass filter to a expansion circuit for non-linearly mapping a narrow band pass filtered signal using said first non-linear factor $n_1$ and a second non-linear factor $n_2$ by governing the dynamics of syllabic compression and expansion of the input signal within the narrow band pass range; and providing an output signal that is spectrally enhanced at an output node that is coupled to said temporal narrow band pass filter for each signal channel, said output signal having a range of frequencies that is defined responsive to the narrow band pass range for each signal channel.

* * * * *